(12) United States Patent
Takada

(10) Patent No.: US 9,343,566 B2
(45) Date of Patent: May 17, 2016

(54) SEMICONDUCTOR DEVICE

(71) Applicant: FUJITSU SEMICONDUCTOR LIMITED, Yokohama-shi, Kanagawa (JP)

(72) Inventor: Kazuhiko Takada, Mitaka (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/292,136

(22) Filed: May 30, 2014

(65) Prior Publication Data

US 2015/0001621 A1 Jan. 1, 2015

(30) Foreign Application Priority Data

Jun. 28, 2013 (JP) ................................. 2013-136248

(51) Int. Cl.
*H01L 29/78* (2006.01)
(52) U.S. Cl.
CPC ........ *H01L 29/7816* (2013.01); *H01L 29/7835* (2013.01)
(58) Field of Classification Search
CPC ............ H01L 29/7816; H01L 29/0852; H01L 29/0873; H01L 29/0856; H01L 29/7801; H01L 29/7806
USPC ......................................... 257/336, 340, 335
See application file for complete search history.

(56) References Cited

U.S. PATENT DOCUMENTS 6,924,531 B2 *  8/2005  Chen et al. ..................... 257/336
8,698,236 B2 *  4/2014  Takeda et al. .................. 257/335
2001/0019166 A1  9/2001  Tsuyuki
2007/0057280 A1  3/2007  Hayashi et al.
2009/0032869 A1 * 2/2009  Matsudai et al. .............. 257/336
2012/0112240 A1 * 5/2012  Takeda et al. .................. 257/133
2013/0020632 A1 * 1/2013  Disney .......................... 257/328

FOREIGN PATENT DOCUMENTS

JP    2001-250921 A    9/2001
JP       2007-81041 A    3/2007
JP    2009-130099 A    6/2009

OTHER PUBLICATIONS

Definition of "Include", http://www.merriamwebster.com (2014).*

* cited by examiner

*Primary Examiner* — Yu Chen
*Assistant Examiner* — Nilufa Rahim
(74) *Attorney, Agent, or Firm* — Westerman, Hattori, Daniels & Adrian, LLP

(57) ABSTRACT

A semiconductor device including a gate insulating film; a gate electrode; a source region of a first conductivity; a drain region of the first conductivity type; a drift region of the first conductivity type formed between the channel region and the drain region; a first semiconductor region of a second conductivity type that encloses the source region, the drift region and the drain region, and includes the channel region; and a first shield wiring that encloses a portion of the source region in a plan view in conjunction with the gate electrode, the portion being not covered by the gate electrode, and is connected to the first semiconductor region, or that covers the portion and is connected to the first semiconductor region and the source region.

19 Claims, 34 Drawing Sheets

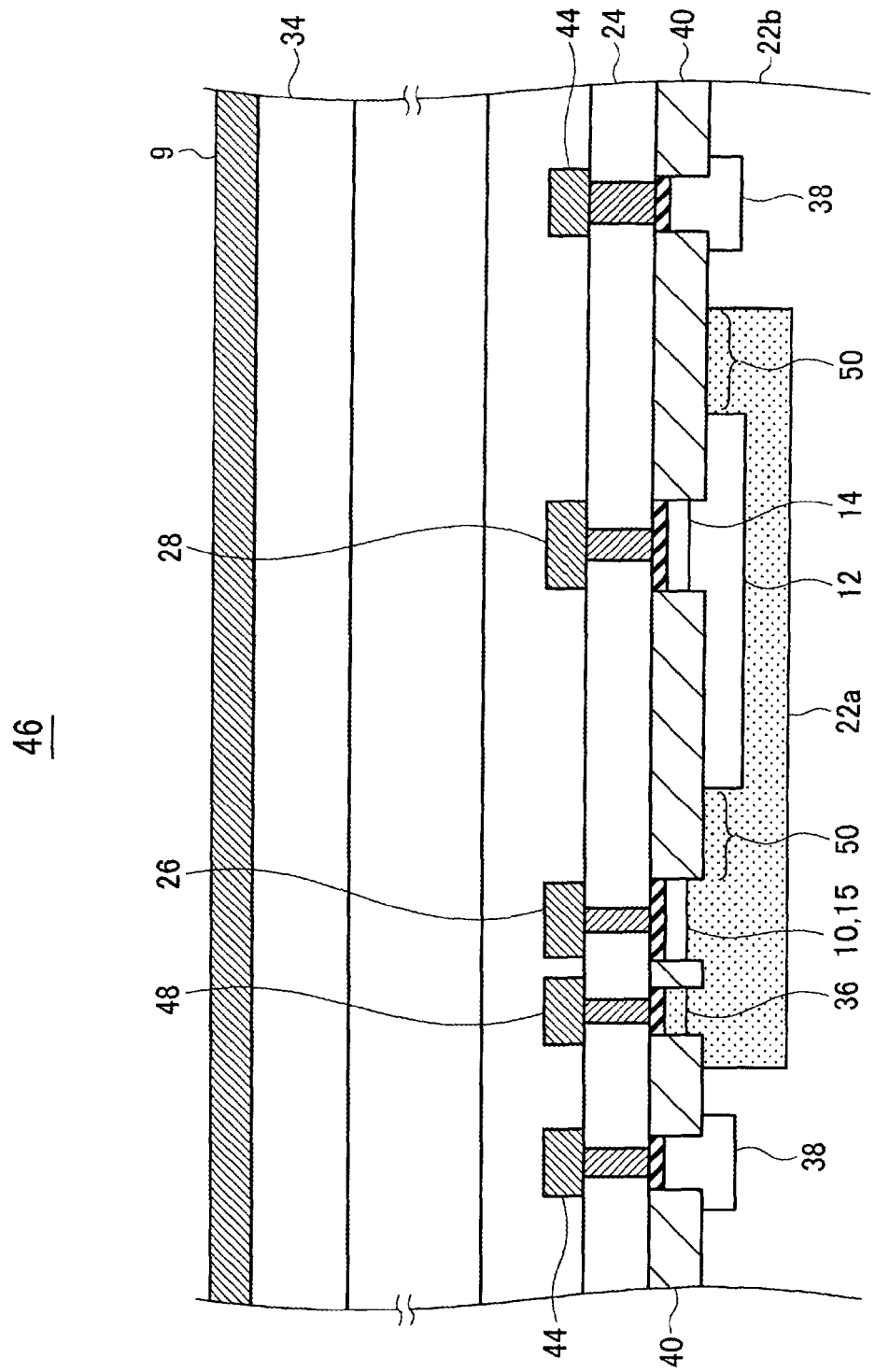

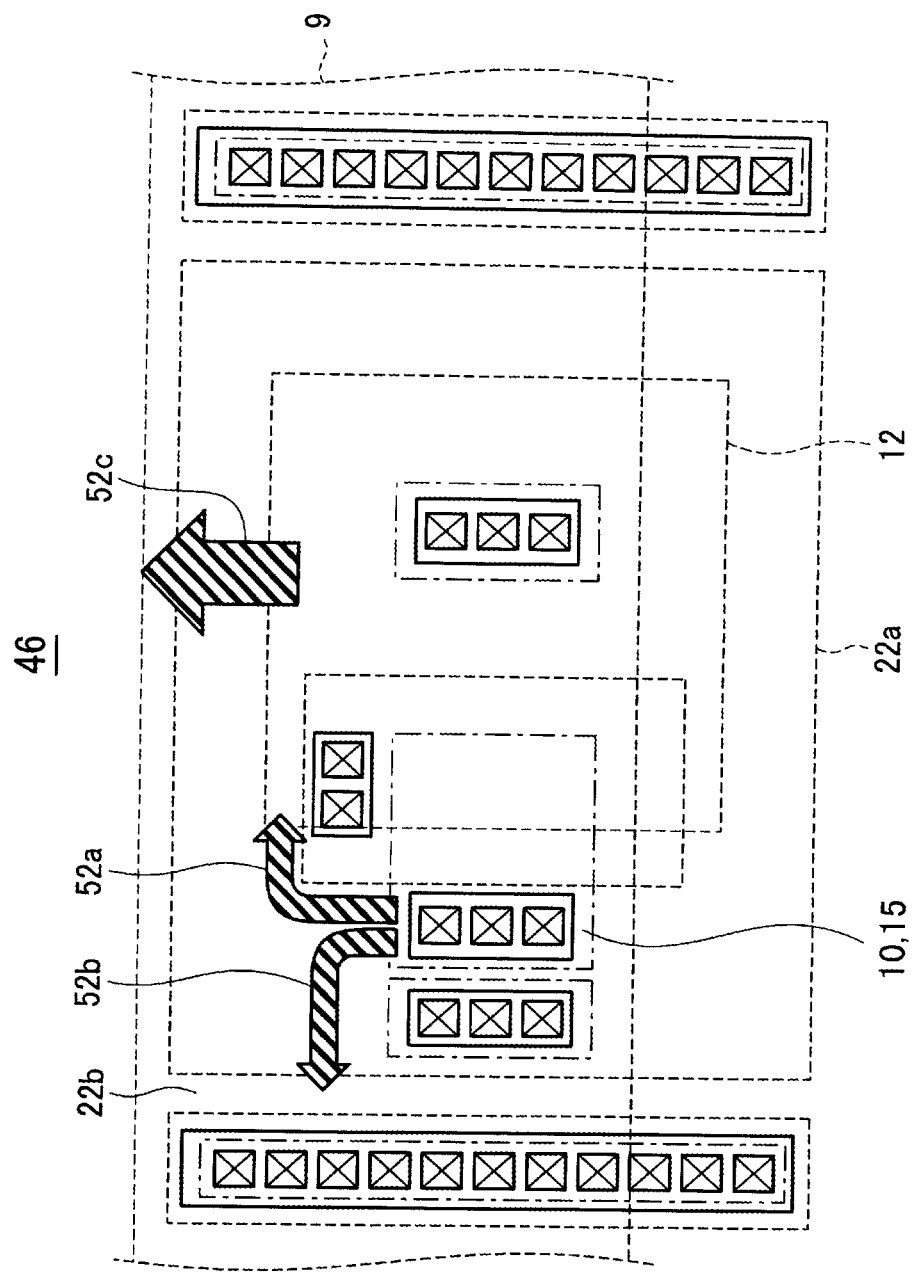

US 9,343,566 B2

SEMICONDUCTOR DEVICE

CROSS-REFERENCE TO RELATED APPLICATION

This application is based upon and claims the benefit of priority of the prior Japanese Patent Application No. 2013-136248, filed on Jun. 28, 2013, the entire contents of which are incorporated herein by reference.

FIELD

The embodiments discussed herein are related to a semiconductor device.

BACKGROUND

In a lateral diffused MOS (metal oxide semiconductor) transistor (hereafter referred to as an LDMOS transistor), high voltage is capable of being applied between a source and a drain (for example, refer to Japanese Laid-open Patent Publication No. 2007-81041 and Japanese Laid-open Patent Publication No. 2009-130099).

SUMMARY

According to an aspect of the embodiments, a semiconductor device includes a semiconductor substrate that includes a channel region; a gate insulating film formed on the channel region of the semiconductor substrate; a gate electrode formed on the gate insulating film; a source region of a first conductivity type formed in the semiconductor substrate; a drain region of the first conductivity type formed in the semiconductor substrate; a drift region of the first conductivity type formed between the channel region and the drain region, the drift region having an impurity concentration lower than an impurity concentration of the drain region; a first semiconductor region of a second conductivity type opposite to the first conductivity type that encloses the source region, the drift region and the drain region, and includes the channel region; and a first shield wiring that encloses a portion of the source region in a plan view in conjunction with the gate electrode, the portion being not covered by the gate electrode, and is connected to the first semiconductor region, or that covers the portion and is connected to the first semiconductor region and the source region.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 illustrates a cross section along the line VI-VI depicted in FIG. 5,
FIG. 7 illustrates current paths formed in the first semiconductor region of the semiconductor device that does not include the first shield wiring.

DESCRIPTION OF EMBODIMENTS

As described previously, high voltage is capable of being applied between a source and a drain in the LDMOS transistor. The LDMOS transistor is mounted on one substrate together with a digital circuit such as CPU (central processing unit), for example. An integrated circuit on which the LDMOS transistor and the digital circuit are mounted in a mixed manner is mounted on a vehicle, for example, so as to control a high voltage of several tens of voltages generated by a battery.

In such an integrated circuit, wiring (ground wiring, for example) is often provided above the LDMOS transistor. This produces an increased leakage current of the LDMOS transistor.

According to embodiments, the leakage current of the semiconductor device including the LDMOS transistor is suppressed.

Preferred embodiments will be explained with reference to accompanying drawings. Here, identical symbols are given to corresponding parts even in different drawings, and the description thereof will be omitted.

(Embodiment 1)

(1) Structure

Figure 1:
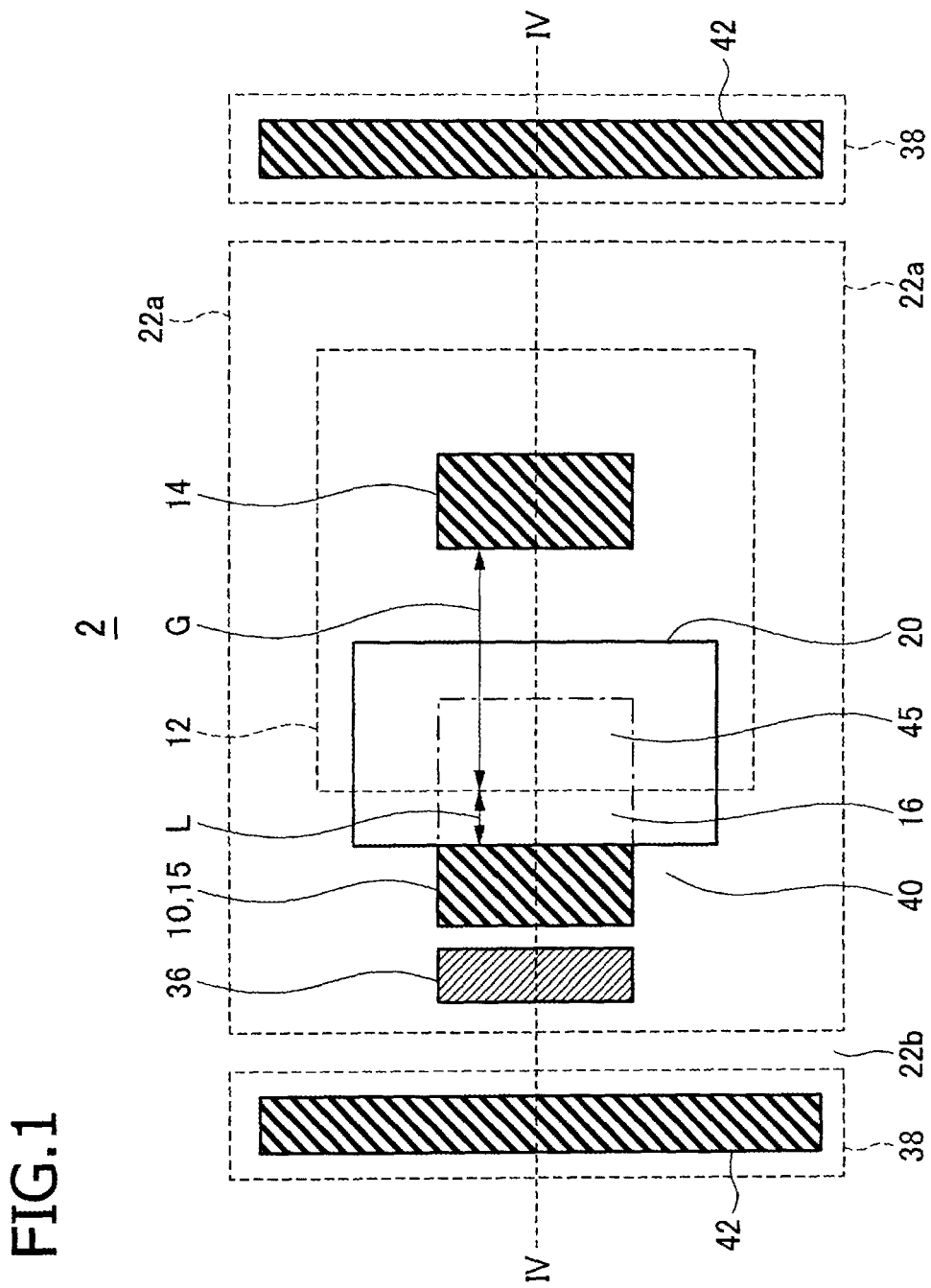
FIG. 1 illustrates a plan view of a semiconductor device according to an embodiment 1.
Figure 2:
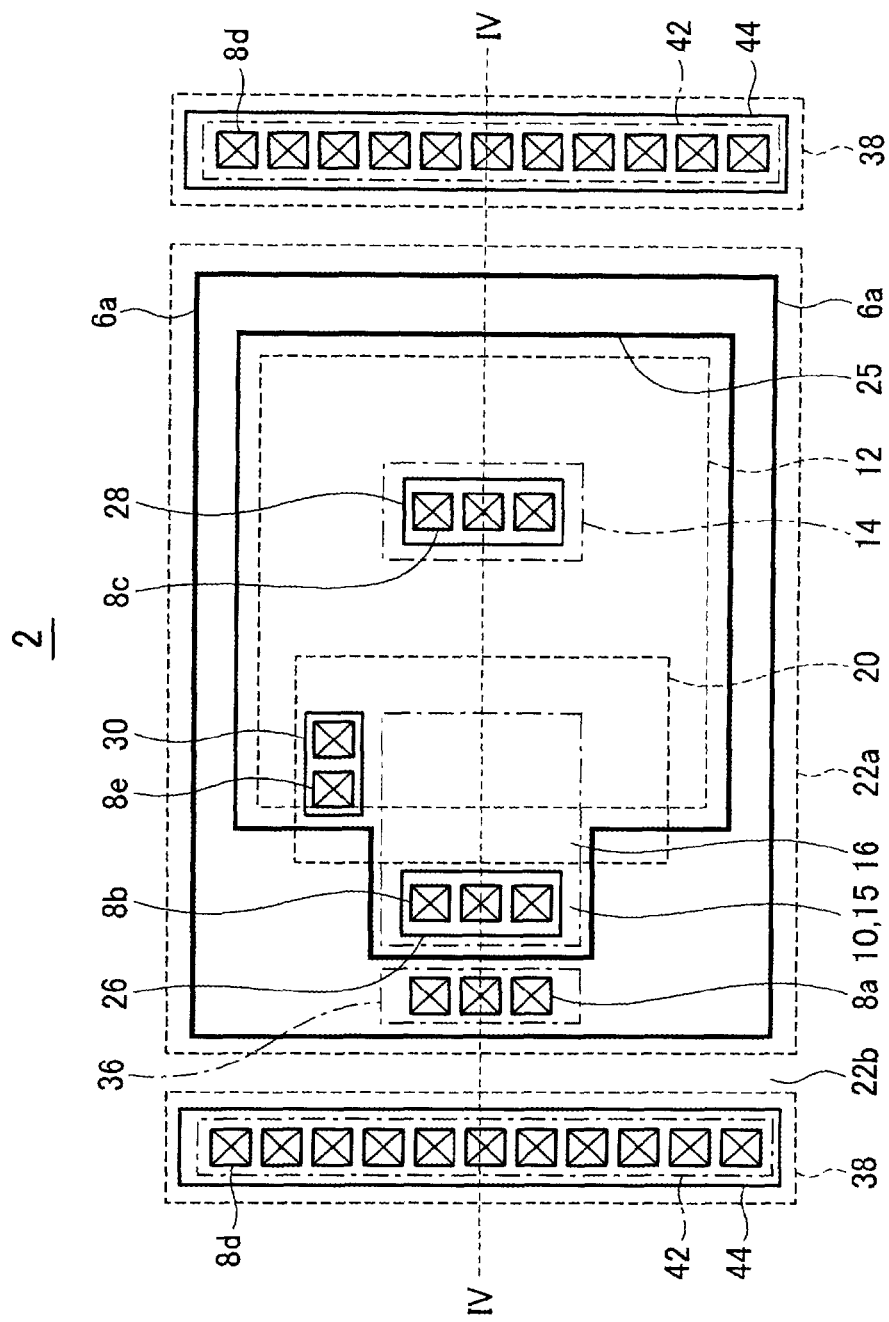
FIG. 2 illustrates a plan view of the semiconductor device according to the embodiment 1.
Figure 3:
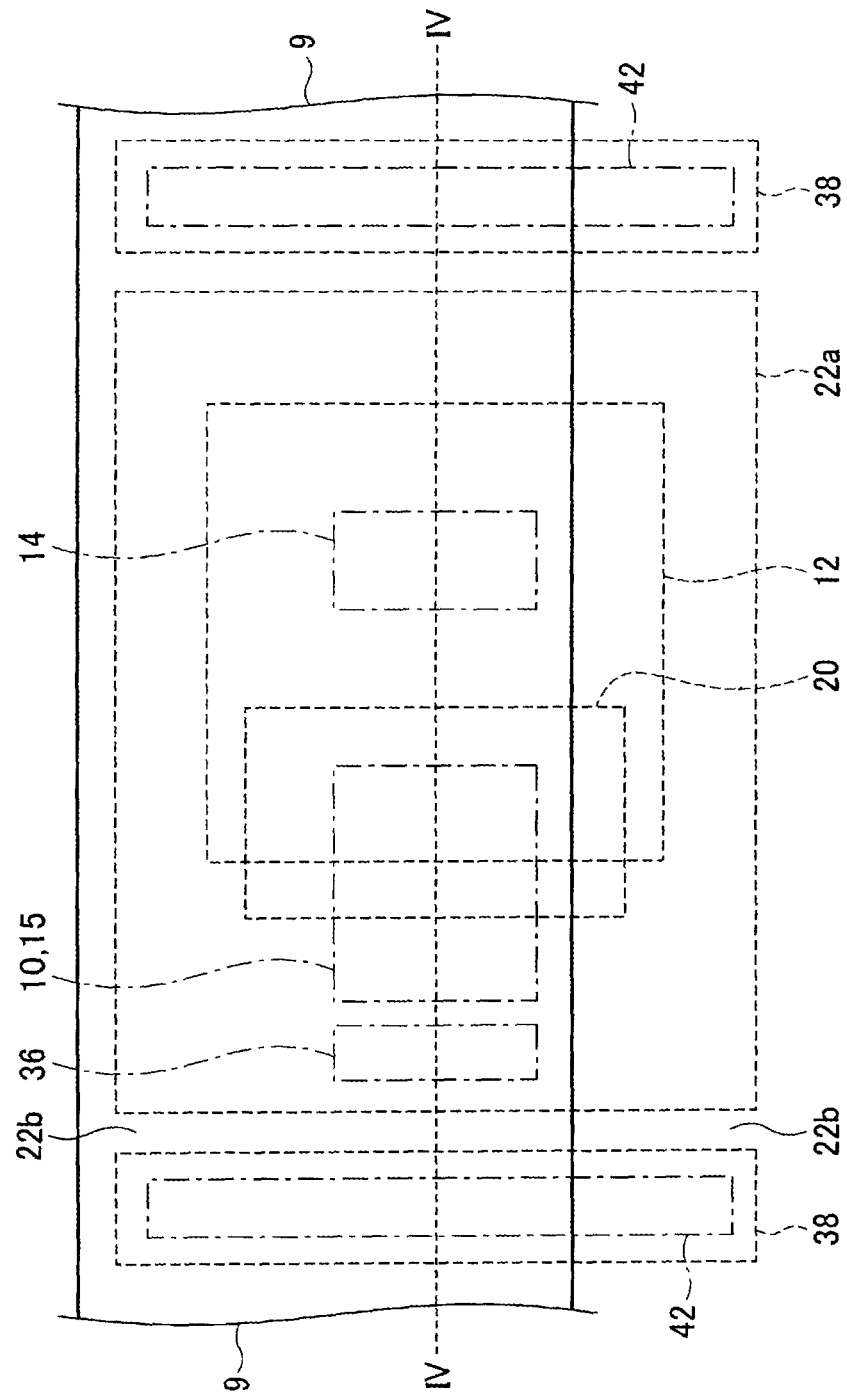
FIG. 3 illustrates a plan view of the semiconductor device according to the embodiment 1.
Figure 4:
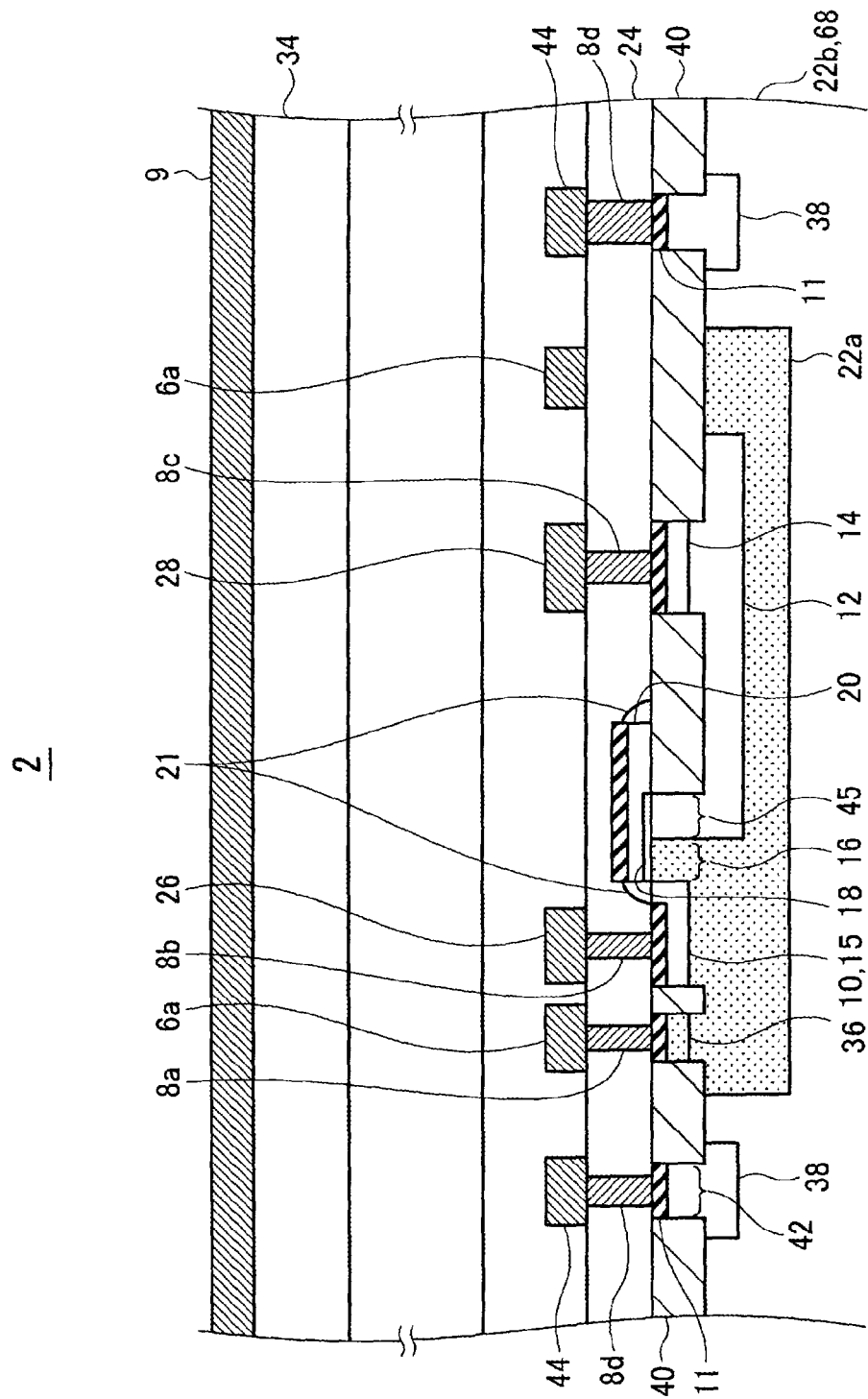
FIG. 4 illustrates a cross section along the line IV-IV of FIGS. 1-3.

FIGS. 1 through 3 illustrate plan views of a semiconductor device 2 according to the embodiment 1. FIG. 4 illustrates a cross section along the line IV-IV of FIGS. 1-3.

FIG. 1 illustrates the structure of the semiconductor device 2 (LDMOS transistor) at a substrate surface (a surface of a substrate where the semiconductor device 2 is formed).

FIG. 2 illustrates wirings (a first shield wiring 6a etc.) provided on an interlayer insulating film 24 (refer to FIG. 4) that is the first layer, for example, and first contact plugs 8a-fifth contact plugs 8e provided in the interlayer insulating film 24 (the first layer). FIG. 2 further illustrates the structure of the substrate surface (refer to FIG. 1) with broken lines and alternate long and short dash lines.

FIG. 3 illustrates a wiring 9 (for example, a ground wiring) provided on an interlayer insulating film 34 (refer to FIG. 4) that is the uppermost layer, for example. FIG. 3 further illustrates the structure of the substrate surface (refer to FIG. 1) with broken lines and alternate long and short dash lines.

As illustrated in FIGS. 1 and 4, the semiconductor device 2 includes a p-type (first conductivity type) source region 10. Further, as illustrated in FIG. 4, the semiconductor device 2 includes a gate insulating film 18 disposed at least on a channel region 16 on one side of the source region 10. The semiconductor device 2 further includes a gate electrode 20 that faces the channel region 16 across the gate insulating film 18.

That is to say, the semiconductor device 2 includes the gate insulating film 18 formed on the channel region 16 of a semiconductor substrate 68, and the gate electrode 20 formed on the gate insulating film 18. The first semiconductor device 2 also includes the source region 10 of a first conductivity type formed on the semiconductor substrate 68.

Further, as illustrated in FIG. 1, the semiconductor device 2 includes a p-type drift region 12 that faces the source region 10 across the channel region 16, with a p-type impurity concentration (a impurity concentration of the first conductivity type) lower than that of the source region 10. The semiconductor device 2 further includes a p-type drain region 14 disposed in the drift region 12, with a p-type impurity concentration higher than that of the drift region 12.

That is to say, the semiconductor device 2 includes the drain region 14 of the first conductivity type formed at the semiconductor substrate 68. The semiconductor device 2 further includes the drift region 12 of the first conductivity type with an impurity concentration lower than that of the drain region 14. At least a portion of the drift region 12 is formed between the channel region 16 and the drain region 14.

Further, the semiconductor device 2 includes a first semiconductor region 22a of an n-type (a second conductivity type opposite to the first conductivity type) that encloses the source region 10 and the drift region 12 and includes the channel region 16. The semiconductor region 22a is an n-type well, for example. The first semiconductor region 22a is of 2.5 μm-8.0 μm in thickness, for example.

Further, as illustrated in FIG. 2, the semiconductor device 2 includes a first shield wiring 6a that encloses a portion 15 of the source region 10 that is not covered by the gate electrode 20, in a plan view in conjunction with the gate electrode 20 (in FIG. 2, the portion 15 that is not covered by the gate electrode 20 is coincident with the source region 10). The first shield wiring 6a is connected to the first semiconductor region 22a by the first contact plugs 8a, for example.

Specifically, as illustrated in FIG. 4 for example, the first shield wiring 6a is connected to a body tap region 36, which is provided in the first semiconductor region 22a, with an n-type impurity concentration higher than that of the surrounding area. As illustrated in FIG. 4, the first shield wiring 6a faces the first semiconductor region 22a across the interlayer insulating film 24 (the first layer), for example.

The gate electrode 20 covers not only the channel region 16 but also a portion (not illustrated) of the source region 10 that contacts to the channel region 16. The above portion is a region in which p-type impurities that are ion-implanted into the source region 10 are diffused underneath the gate electrode 20 by heat treatment, for example. The side faces of the gate electrode 20 are preferably covered by sidewalls 21.

The semiconductor device 2 may include a p-type second semiconductor region 22b (refer to FIG. 4) that encloses the first semiconductor region 22a (refer to FIG. 1). For example, the second semiconductor region 22b is a p-type semiconductor substrate 68. In this case, as illustrated in FIG. 2, the first shield wiring 6a preferably includes an inner edge (inner periphery) 25 that encloses at least the drift region 12 inside the first semiconductor region 22a in a plan view. It may be possible that the outer edge (outer periphery) of the first shield wiring 6a is not in the first semiconductor region 22a. For example, the outer edge (outer periphery) of the first shield wiring 6a may be in the second semiconductor region 22b in a plan view.

As illustrated in FIGS. 3 and 4, the semiconductor device 2 further includes a wiring 9 that faces the first semiconductor region 22a across the first shield wiring 6a. Potential lower than that of the source region 10 (for example, substrate potential) is applied to the wiring 9. The wiring 9 is a ground wiring connected to the second semiconductor region 22b, for example. Preferably, the wiring 9 (hereafter referred to as low potential wiring) is provided on the interlayer insulating film 34 that is the uppermost layer, for example.

As illustrated in FIGS. 1 and 4, the channel region 16 is separated from the drain region 14 by the drift region 12. The impurity concentration of the drift region 12 (for example, $1\times10^{15}$ to $5\times10^{17}$ cm$^{-3}$) is lower than the impurity concentration of the drain region 14. Therefore, the resistivity of the drift region 12 is higher than the resistivity of the drain region 14. Further, the drift region 12 is covered and thinned by a field insulating film 40, excluding a portion 45 that contacts to the channel region 16. This produces a high resistance of the drift region 12. Accordingly, the gate insulating film 18 is not easily broken when high potential (for example, 40-120 V) is applied to the source region 10.

When potential (for example, 80 V) that is substantially identical to the potential of the source region 10 is applied to the gate electrode 20, the channel region 16 becomes a non-conductive state. On the other hand, when potential lower by several Volts (for example, 5 V) than the potential of the source region 10 is applied to the gate electrode 20, the channel region 16 becomes a conductive state.

When the channel region 16 becomes conductive, a high voltage close to the potential of the source region 10 is applied between the source region 10 and the drain region 14. The gate insulating film 18 is broken if the above voltage is directly applied to the channel region 16.

However, because the voltage is decreased by the resistance of the drift region 12, a voltage between the source region 10 and the drain region 14 is not directly applied to the channel region 16. Therefore, the gate insulating film 18 is not easily broken.

To suppress a voltage applied to the channel region 16, it is preferable that a distance G (refer to FIG. 1) between the drain region 14 and the channel region 16 is longer. For example, the distance G is preferably longer than a length L of the channel region 16 in a direction from the source region 10 to the drain region 14. Preferably, the distance G between the drain region 14 and the channel region 16 is 1.5 µm to 10 µm.

As illustrated in FIG. 2, the first shield wiring 6a preferably covers two corners of the gate electrode 20, which are positioned at the source region 10 side, among four corners of the gate electrode 20. By means of this, even when the formation position of the first shield wiring 6a deviates from a target position to some extent, the first shield wiring 6a and the gate electrode 20 may enclose the source region 10. The width of a region in which the first shield wiring 6a overlaps with the gate electrode 20 is around 0.5 µm, for example.

The first semiconductor region 22a and the second semiconductor region 22b are covered by the field insulating film 40, excluding the source region 10, the channel region 16, the drain region 14, the body tap region 36, substrate tap regions 38, etc. (refer to FIG. 4).

As illustrated in FIG. 4, the source region 10 is connected to a source wiring 26 by the second contact plugs 8b. The drain region 14 is connected to a drain wiring 28 by the third contact plugs 8c. The second semiconductor region 22b is connected to substrate tap wirings 44 by the fourth contact plugs 8d. Specifically, the second semiconductor region 22b is connected thereto through a region 42 of the substrate tap region 38 that is not covered by the field insulating film 40, for example. As illustrated in FIG. 2, the gate electrode 20 is connected to a gate wiring 30 by the fifth contact plugs 8e.

Additionally, as illustrated in FIG. 4, each surface of the source region 10, the drain region 14, the gate electrode 20, the body tap region 36 and the substrate tap regions 38 is covered by each contact electrode 11. In FIGS. 1-3, the contact electrodes 11 are omitted.

(2) Suppression of Leakage Current
—Leakage Current Path—

An reverse bias voltage between about 40V and about 120 V is applied between the first semiconductor region 22a (refer to FIG. 4) and the second semiconductor region 22b, for example. This produces an increased electric field at a junction plane (pn junction) between the first semiconductor region 22a and the second semiconductor region 22b. As a result, an avalanche breakdown is easy to occur at the junction plane. Such a breakdown also easily occurs at a junction plane between the first semiconductor region 22a and the drift region 12.

Accordingly, the n-type impurity concentration of the first semiconductor region 22a is set to low concentration. The n-type impurity concentration of the first semiconductor region 22a is between $1 \times 10^{15}$ and $5 \times 10^{16}$ cm$^{-3}$ (or $5 \times 10^{15}$ to $1 \times 10^{16}$ cm$^{-3}$), for example. Therefore, an inversion layer is formed in the first semiconductor region 22a even when a relatively weak electric field is applied to an interface between the first semiconductor region 22a and the field insulating film 40.

Figure 5:
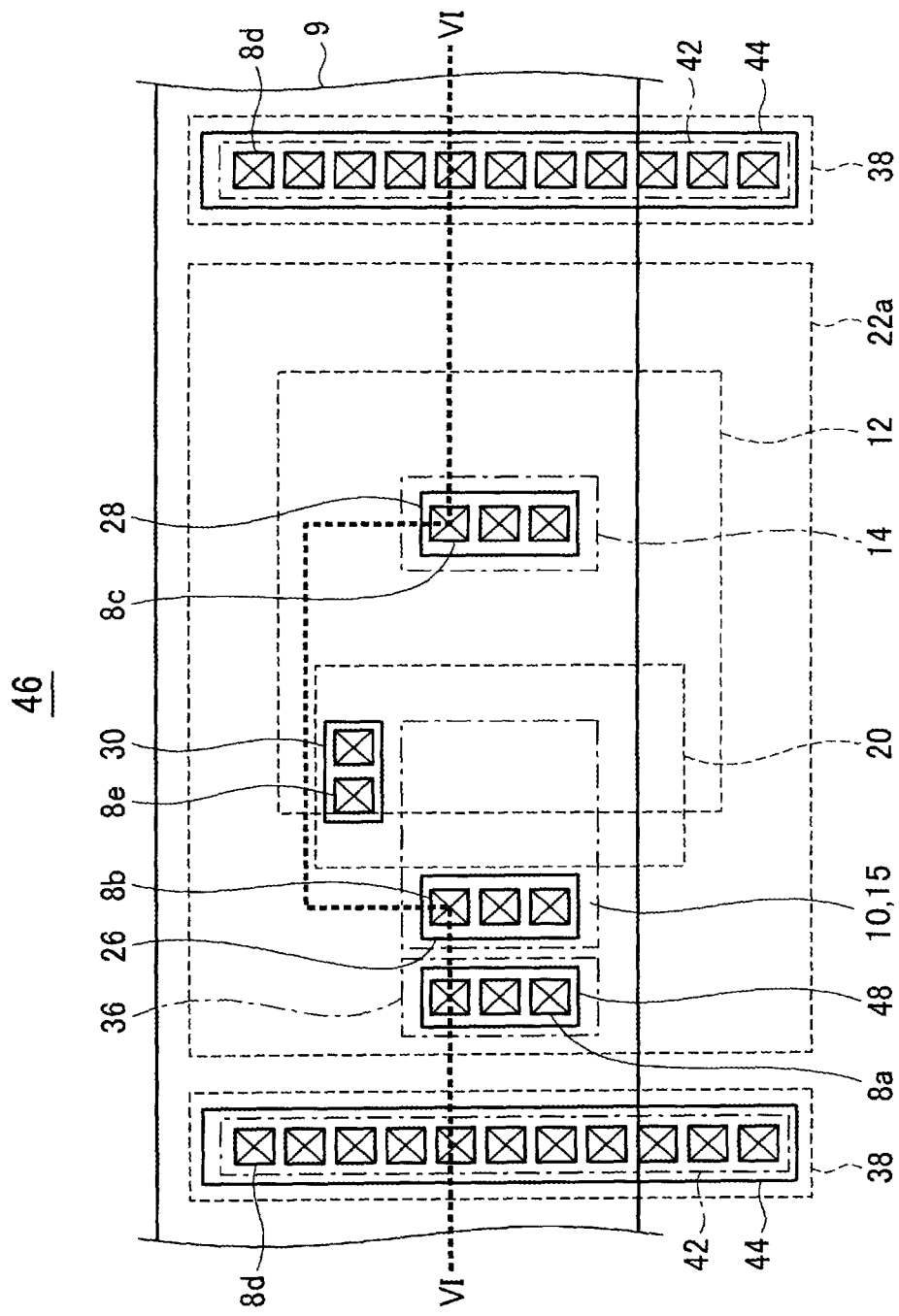
FIG. 5 illustrates a plan view of a semiconductor device that does not include the first shield wiring.
Figure 8A:
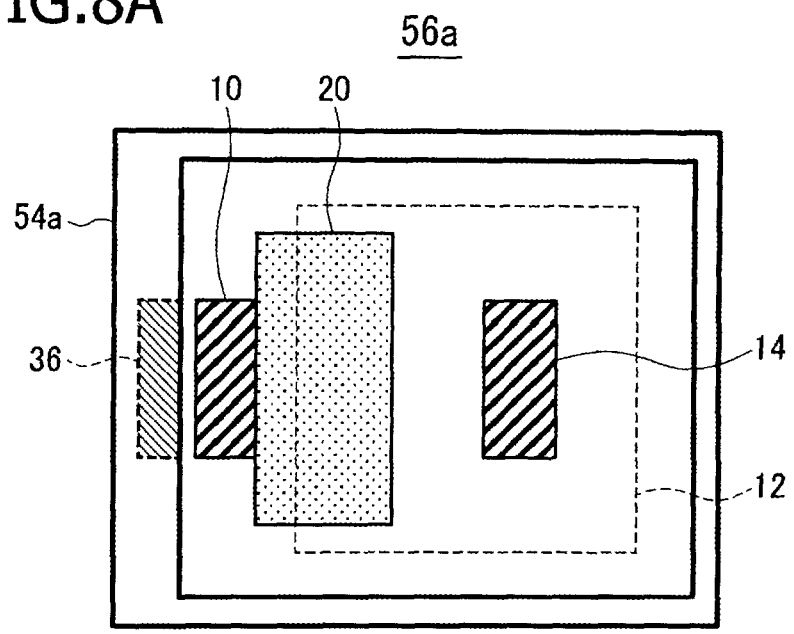
FIGS. 8A and 8B illustrate change in the drain saturation current of the LDMOS transistor including a shield wiring.
Figure 8B:
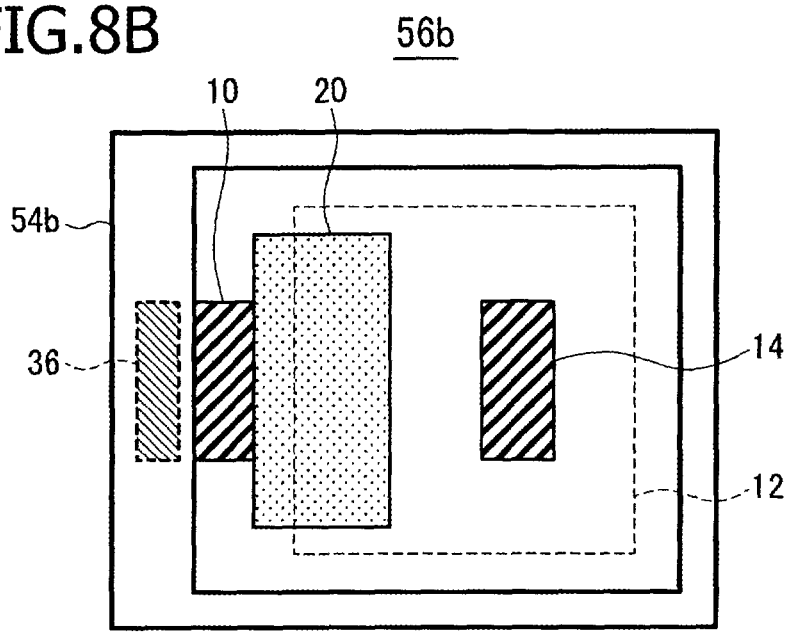
Figure 9A:
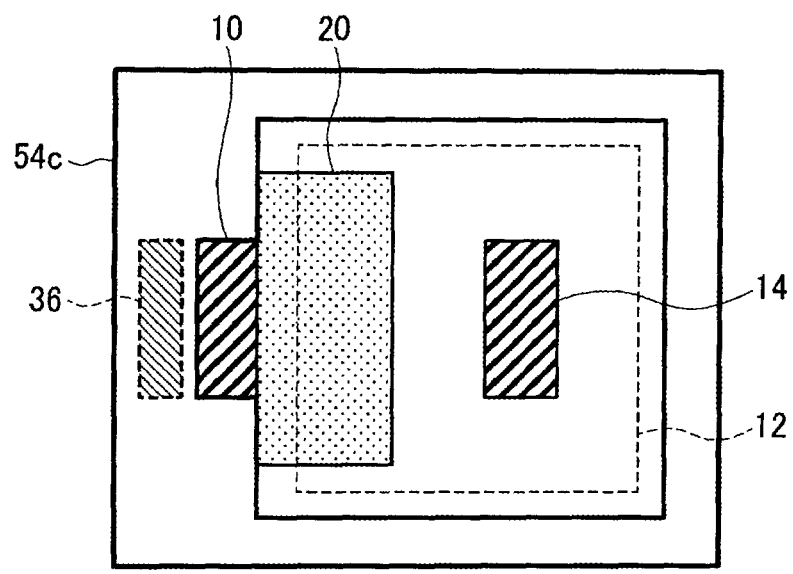
FIGS. 9A and 9B illustrate change in the drain saturation current of the LDMOS transistor including a shield wiring.
Figure 9B:
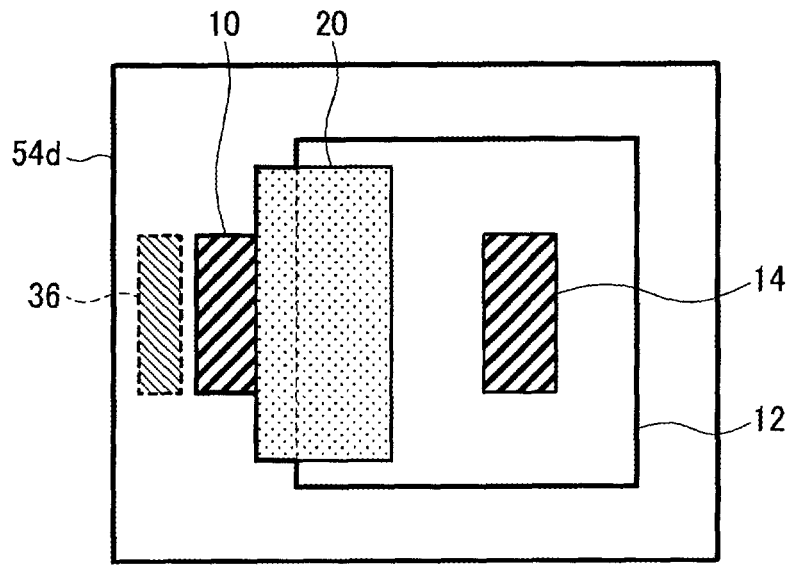

FIG. 5 illustrates a plan view of a semiconductor device 46 that does not include a first shield wiring 6a. FIG. 6 illustrates a cross section along the line VI-VI depicted in FIG. 5. Broken lines and alternate long and short dash lines depicted in FIG. 5 illustrate a structure (LDMOS) of a substrate surface. The solid lines depicted in FIG. 5 illustrate wirings provided on the interlayer insulating film 24 (refer to FIG. 6) that is the first layer, and the first contact plugs 8a-the fifth contact plugs 8e provided in the interlayer insulating film 24 (the first layer). The solid lines depicted in FIG. 5 further illustrate a low potential wiring (for example, a ground wiring) provided on the interlayer insulating film 34 (refer to FIG. 6) that is the uppermost layer.

In the semiconductor device 46, the body tap region 36 is connected to a body tap wiring 48 instead of the first shield wiring 6a. In contrast to the first shield wiring 6a, the body tap wiring 48 does not enclose the source region 10 and/or the drift region 12. The structure of the semiconductor device 46 depicted in FIG. 5 is substantially identical to the semiconductor device 2 in the embodiment 1, excluding that the semiconductor device 46 includes the body tap wiring 48 instead of the first shield wiring 6a.

As described above, high potential (for example, 80 V) is applied to the first semiconductor region 22a. On the other hand, substrate potential (0 V) is applied to a low potential wiring 9, for example. A strong electric field directed from the first semiconductor region 22a to the low potential wiring 9 is generated at an interface 50 (refer to FIG. 6) between the first semiconductor region 22a and the field insulating film 40. By this electric field, an inversion layer is generated in the first semiconductor region 22a, and a current path is formed at the surface of the first semiconductor region 22a.

FIG. 7 illustrates current paths formed in the first semiconductor region 22a of the semiconductor device 46. As illustrated in FIG. 7, a first current path 52a that connects the source region 10 to the drift region 12 is formed in the first semiconductor region 22a.

Further, a second current path 52b that connects the source region 10 to the second semiconductor region 22b is formed in the first semiconductor region 22a. Further, a third current path 52c that connects the drift region 12 to the second semiconductor region 22b is formed in the first semiconductor region 22a. Through the above current paths, leakage currents flow in the semiconductor device 46.

In the semiconductor device 46, for example, a mA-order current (1-10mA) flows in a conductive state (ON state). On the other hand, in a non-conductive state (OFF state), a µA-order current (1-10µA) flows in the semiconductor device 46.

—Suppression of Source-drain Leakage Current—

The first shield wiring 6a (refer to FIG. 2) is connected to the first semiconductor region 22a. By means of this, the electric field generated by the low potential wiring 9 (refer to FIG. 4) is shielded, so that the electric field does not reach a portion of the first semiconductor region 22a that is covered by the first shield wiring 6a. Therefore, no inversion layer is formed in the above portion. Accordingly, no current path (physical path) is formed in the portion of the first semiconductor region 22a that is covered by the first shield wiring 6a.

As well as the first shield wiring 6a, the gate electrode 20 shields the electric field generated by the low potential wiring 9. Therefore, no current path is formed in a portion of the first semiconductor region 22a that is covered by the gate electrode 20 (here, the current path does not include a signal current path, like the channel region 16 for example, through which a signal current flows in response to the potential of the gate electrode 20; the same is applicable hereafter.)

As described by reference to FIG. 2, the first shield wiring 6a encloses a portion 15 of the source region 10 that is not covered by the gate electrode 20 (in FIG. 2, the portion 15 is coincident with the source region 10), in a plan view in conjunction with the gate electrode 20. Therefore, the first shield wiring 6a covers a portion (region through which the first current path 52a passes) of the first semiconductor region 22a that connects the source region 10 to the drift region 12, in a plan view in conjunction with the gate electrode 20.

As described above, no current path is formed in the portion of the first semiconductor region 22a that is covered by the first shield wiring 6a. Similarly, no current path is formed in a portion of the first semiconductor region 22a that is covered by the gate electrode 20.

Therefore, in the semiconductor device 2 including the first shield wiring 6a, such a first current path 52a (refer to FIG. 7) that connects the source region 10 to the drift region 12 is not formed. The drain region 14 is formed in the drift region 12. Therefore, according to the semiconductor device 2, suppressed is a leakage current that flows from the source region 10 to the drain region 14.

As illustrated in FIG. 2, there is no possibility of the existence of a path (geometric path) that connects the source region 10 to the drift region 12 (or the drain region 14) without passing through any of the first shield wiring 6a and the gate electrode 20 in a plan view. In other words, the first shield wiring 6a isolates the source region 10 from the drift region 12 (or the drain region 14) in a plan view in conjunction with the gate electrode 20. Therefore, the first current path 52a is not formed in the semiconductor device 2.

—Suppression of Leakage Current Between the Source and the Second Semiconductor Region—

As illustrated in FIG. 7, the low potential wiring 9 covers a portion (region through which the second current path 52b passes) of the first semiconductor region 22a that connects between the source region 10 and the second semiconductor region 22b. Therefore, in the semiconductor device 46 not including the first shield wiring 6a, formed is the second current path 52b that passes through the first semiconductor region 22a to connect the source region 10 to the second semiconductor region 22b, as illustrated in FIG. 7.

On the other hand, in the semiconductor device 2, the first shield wiring 6a covers the portion (region through which the second current path 52b passes) of the first semiconductor region 22a that connects the source region 10 to the second semiconductor region 22b, in a plan view in conjunction with the gate electrode 20, as illustrated in FIG. 2.

Therefore, according to the semiconductor device 2, a leakage current that flows from the source region 10 to the second semiconductor region 22b is suppressed.

As illustrated in FIG. 2, there is no possibility of the existence of a path (geometric path) that connects the source region 10 with the second semiconductor region 22b without passing through any of the first shield wiring 6a and the gate electrode 20, in a plan view. In other words, the first shield wiring 6a isolates the source region 10 from the second semiconductor region 22b in a plan view in conjunction with the gate electrode 20. Therefore, the second current path 52b is not formed in the semiconductor device 2.

—Suppression of Leakage Current Between the Drain and the Second Semiconductor Region—

As illustrated in FIG. 7, the low potential wiring 9 covers the portion (region through which a third current path 52c passes) of the first semiconductor region 22a that connects the drift region 12 to the second semiconductor region 22b. Therefore, as illustrated in FIG. 7, in the semiconductor device 46 not including the first shield wiring 6a, formed is the third current path 52c that connects the drift region 12 to the second semiconductor region 22b through the first semiconductor region 22a.

On the other hand, in the semiconductor device 2 as illustrated in FIG. 2, the first shield wiring 6a covers the portion (region through which the third current path 52c passes) that connects the drift region 12 to the second semiconductor region 22b in a plan view. Therefore, the third current path 52c is not formed.

By means of this, in the semiconductor device 2, the third current path 52c that connects the drift region 12 to the second semiconductor region 22b is not formed. The drain region 14 is formed in the drift region 12. Therefore, according to the semiconductor device 2, a leakage current that flows from the drain region 14 to the second semiconductor region 22b is suppressed.

Now, there is no possibility of the existence of a path (geometric path) that connects the drift region 12 to the second semiconductor region 22b without passing through the first shield wiring 6a, in a plan view. In other words, the first shield wiring 6a isolates the drift region 12 (or the drain region 14) from the second semiconductor region 22b in a plan view. Therefore, there is no formation of the third current path 52c in the semiconductor device 2.

As described above, according to the semiconductor device 2 including the first shield wiring 6a, a leakage current that flows through any of the first current path 52a-the third current path 52c is suppressed. Therefore, the leakage current of the semiconductor device 2 is very small.

For example, when the semiconductor device 46 not including the first shield wiring 6a is in a non-conductive state (OFF state), a current flow in the semiconductor device 46 is several µA or so. On the other hand, when the semiconductor device 2 including the first shield wiring 6a is in a non-conductive state (OFF state), a current flow in the semiconductor device 2 is smaller than 1 µA.

Now, the low potential wiring 9 is formed on the interlayer insulating film 34 (the uppermost layer). The thickness of each interlayer insulating film layer is around 1.2 µm, for example. About five interlayer insulating films are stacked on the substrate surface. Therefore, the low potential wiring 9 is disposed at a position around 6 µm from the substrate surface. Even though the low potential wiring 9 is formed at such a position far from the substrate surface, a first semiconductor layer 22a of the semiconductor device 46 not including the first shield wiring 6a is inverted when high potential of 40-120 V is applied to the first semiconductor layer 22a. On the other hand, according to the semiconductor device 2 in the embodiment 1, the electric field formed by the low potential wiring 9 is shielded by the first shield wiring 6a, so that the inversion of the first semiconductor layer 22a is suppressed.

The first shield wiring 6a is not connected to the gate electrode 20. Therefore, capacitance of the gate electrode 20 is not increased by the parasitic capacitance of the first shield wiring 6a.

In the example illustrated in FIG. 2, the first shield wiring 6a only covers two corners of the gate electrode 20 without extending across the gate electrode 20. However, the first shield wiring 6a may extend across the gate electrode 20.

In the example illustrated in FIG. 2, the first shield wiring 6a encloses the drift region 12 in a plan view. However, it may be possible that the first shield wiring 6a does not enclose the drift region 12. Even in such a structure, the first current path 52a and the second current path 52b are not formed. Therefore, a leakage current reduces.

(3) Suppression of Drain Current Variation

When a drain current flows in an LDMOS transistor that includes a shield wiring, a drain saturation current changes in some cases.

FIGS. 8A-12 illustrate a change in the drain saturation current of the LDMOS transistor including a shield wiring. In FIGS. 8A-11, there are illustrated a plurality of LDMOS transistors 56a-56g that include shield wirings 54a-54g. Each structure of the plurality of LDMOS transistors 56a-56g is substantially identical to the structure of the semiconductor device 2 in the embodiment 1 described above by reference to FIGS. 1-4, excluding the shapes of the shield wirings 54a-54g.

The shield wirings 54a-54g are connected to the first semiconductor region 22a (refer to FIG. 1), similarly to the first shield wiring 6a of the semiconductor device 2. Each of the shield wirings 54a-54g covers a different part of the first semiconductor region 22a. Similarly to the first shield wiring 6a, the shield wirings 54a-54g do not cover the source region 10, the drain region 14 and the gate electrode 20.

As illustrated in FIG. 8A-10B, each part covered by the shield wirings 54a-54g gradually extends, and a shield wiring 54f covers most part of the first semiconductor region 22a. Subsequently, the part covered by the shield wiring 54g shrinks in FIG. 11.

Figure 12:
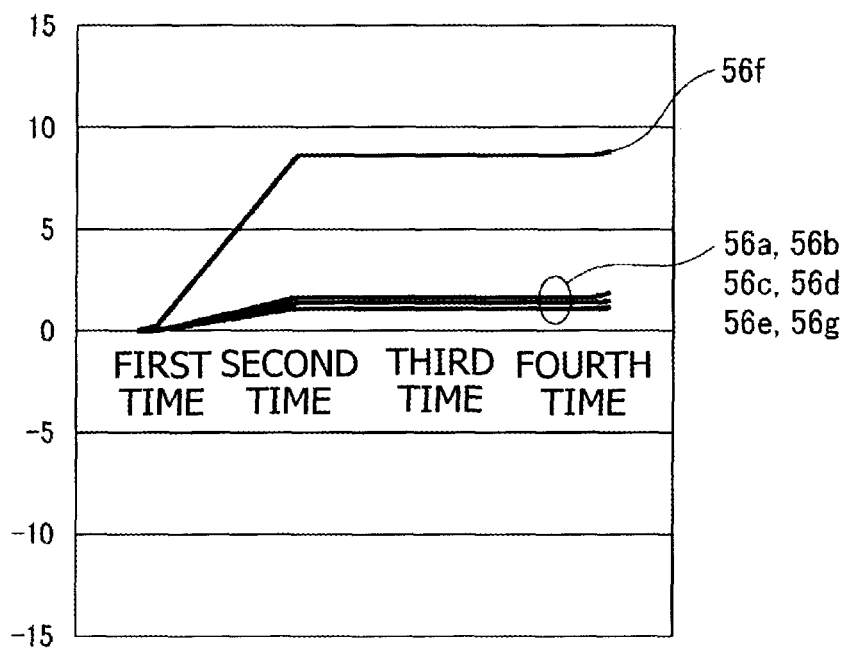
FIG. 12 illustrates change in the drain saturation current of the LDMOS transistors including a shield wiring.

FIG. 12 illustrates an initial drift of the drain saturation current. The horizontal axis depicts the number of times a drain current flows in the LDMOS transistors 56a-56g. The vertical axis depicts a change ratio of the drain saturation current relative to the initial value of the drain saturation current. The symbol added to each characteristic curve depicted in FIG. 12 represents a symbol of LDMOS corresponding to each characteristic curve.

The measurement of the drain saturation current is carried out in a state in which 0 V is applied to the first semiconductor region 22a and the source region 10, and −87 V is applied to the drain region 14. To the gate electrode 20, −6.5 V is applied.

As illustrated in FIG. 12, each initial drift of the drain saturation current of the LDMOS transistors 56a-56e, 56g is small. On the contrary, the drain saturation current of the LDMOS transistor 56f is altered largely due to only one-time flow of a drain current.

Figure 10A:
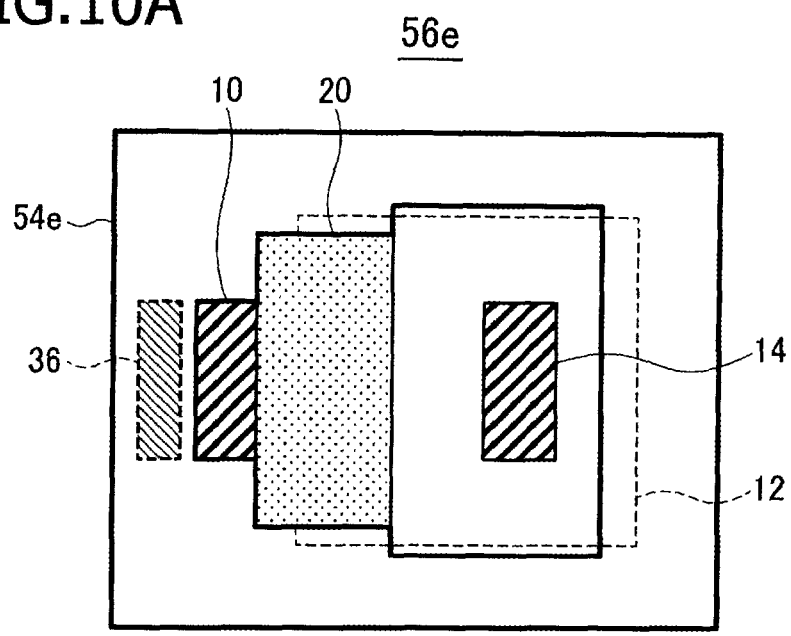
FIGS. 10A and 10B illustrate change in the drain saturation current of the LDMOS transistor including a shield wiring.
Figure 10B:
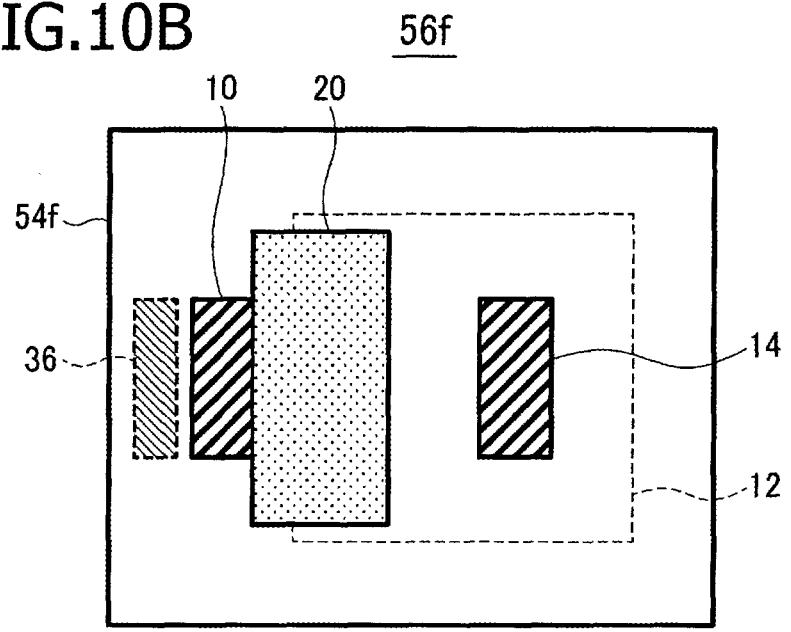
Figure 11:
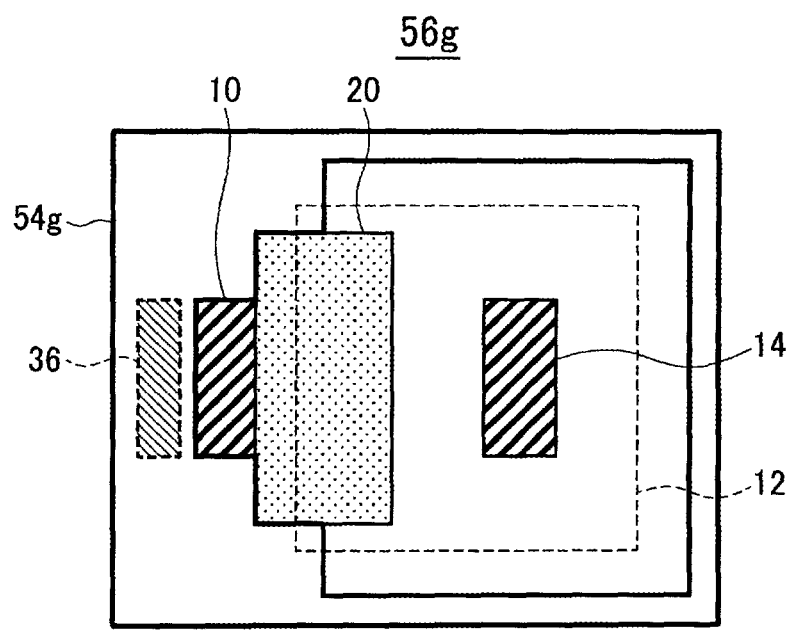
FIG. 11 illustrates change in the drain saturation current of the LDMOS transistor including a shield wiring.

As illustrated in FIG. 10B, the shield wiring 54f of the LDMOS transistor 56f covers a region between the gate electrode 20 and the drain region 14. On the contrary, the shield wirings 54a-54e, 54g of the other LDMOS transistors 56a-56e, 56g do not cover the region between the gate electrode 20 and the drain region 14.

The drift region 12 extends between the gate electrode 20 and the drain region 14. Potential of −87 V, which is applied to the drain region 14, is applied to the drift region 12. Potential of 0 V, which is applied to the first semiconductor region 22a, is applied to the shield wiring 54f. Therefore, an electric field directing from the shield wiring 54f toward the drift region 12 is generated on the surface of the drift region 12.

When the drain current flows, electrons are trapped in the field insulating film 40 by the above electric field. As a result, a resistance of the drift region 12 is changed. It is considered that the drain saturation current is altered by this change of the resistance.

Figure 13:
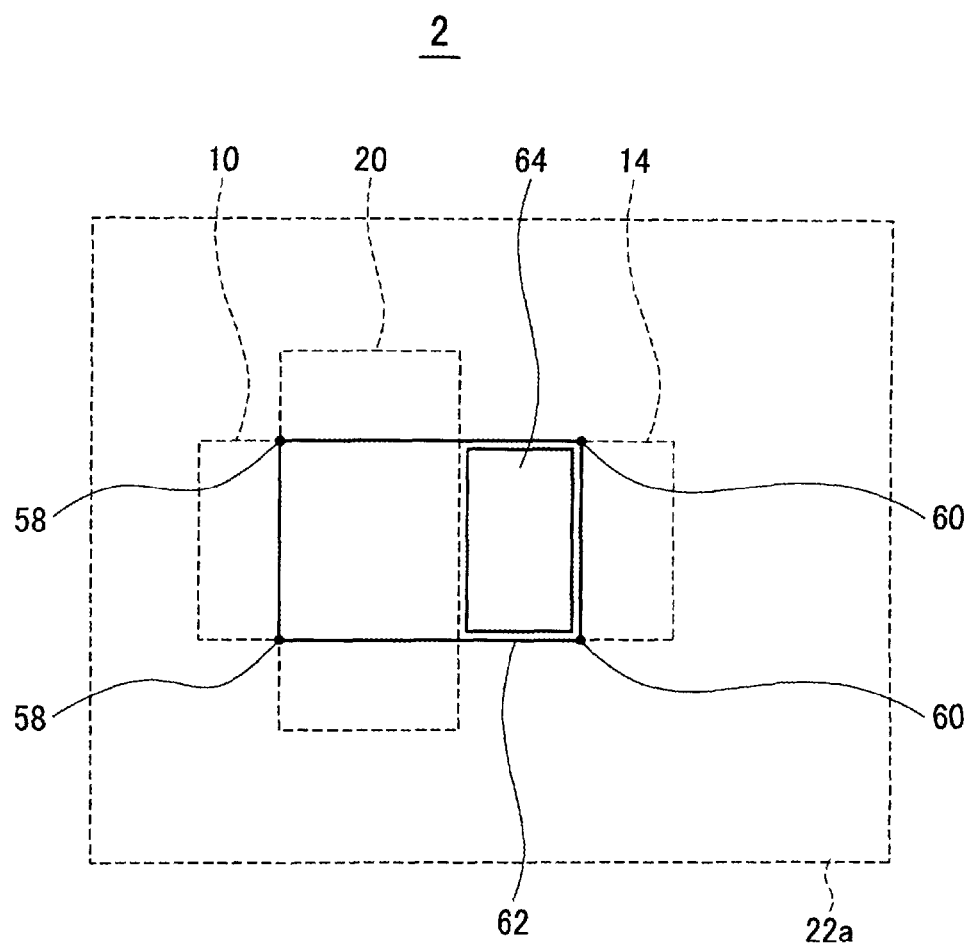
FIG. 13 illustrates a region covered by the first shield wiring.

As illustrated in FIG. 2, the first shield wiring 6a of the semiconductor device 2 according to the embodiment 1 does not cover a region between the gate electrode 20 and the drain region 14. FIG. 13 illustrates a region of the semiconductor device 2 that is covered by the first shield wiring 6a. Broken lines in FIG. 13 illustrate a portion of the substrate surface of the semiconductor device 2.

The drain current flows inside a rectangular region 62. Outer edge of the rectangular region 62 passes through both ends 58 of one side facing the drain region 14 among edges of the source region 10 and both ends 60 of one side facing the source region 10 among edges of the drain region 14. The drain current may result in the trapping of electrons in the field insulating film 40.

Accordingly, the first shield wiring 6a in the embodiment 1 is disposed in such a way that the first shield wiring 6a does not extend above a portion 64 of the rectangular region 62 between the gate electrode 20 and the drain region 14. That is to say, the first shield wiring 6a is not extended between the gate electrode 20 and the drain region 14 in a plan view. Therefore, the initial drift of the drain saturation current of the semiconductor device 2 is small.

(4) Manufacturing Method

Figure 14A:
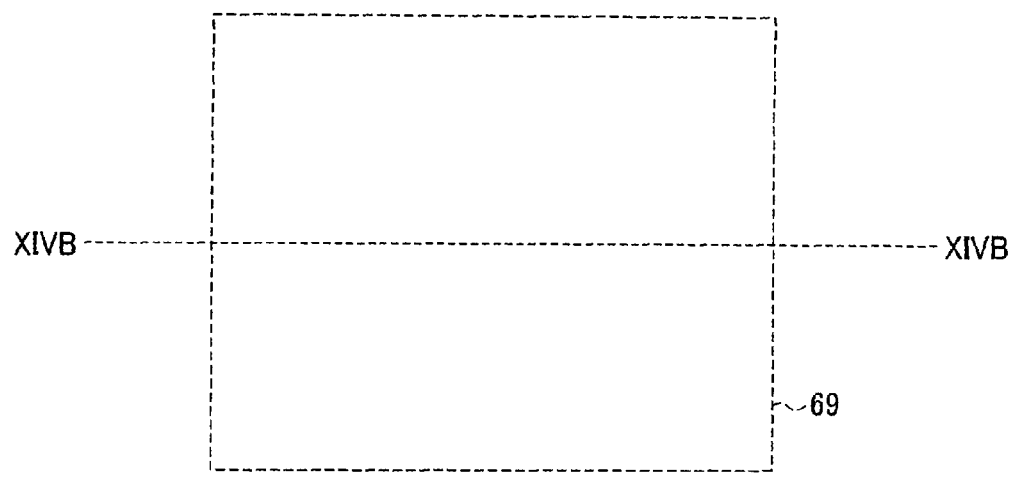
FIGS. 14A and 14B illustrate the manufacturing methods of the semiconductor device according to the embodiment 1.
Figure 14B:
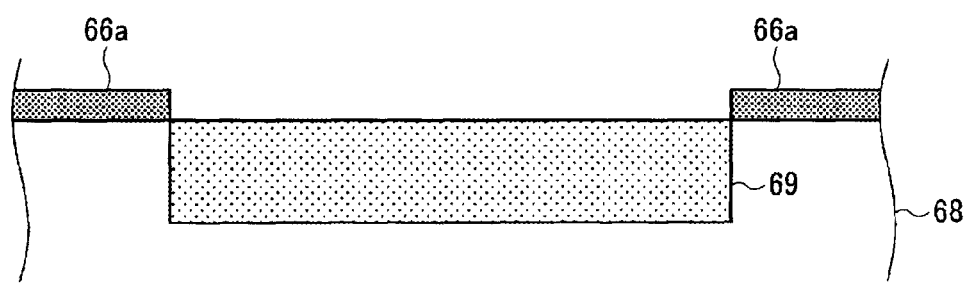
Figure 15A:
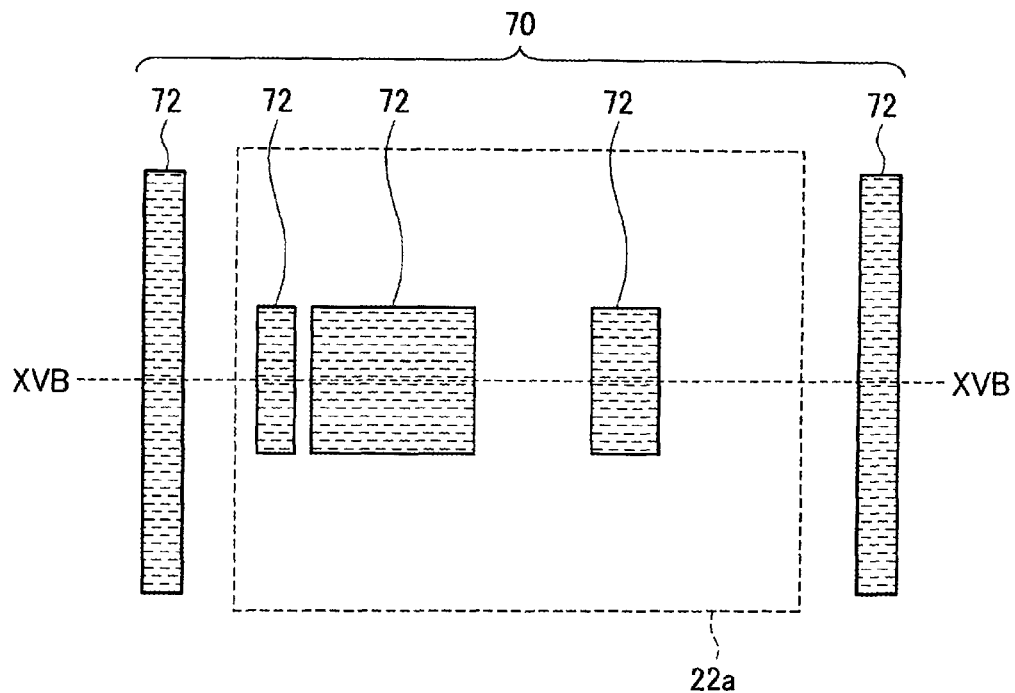
FIGS. 15A and 15B illustrate the manufacturing methods of the semiconductor device according to the embodiment 1.
Figure 15B:
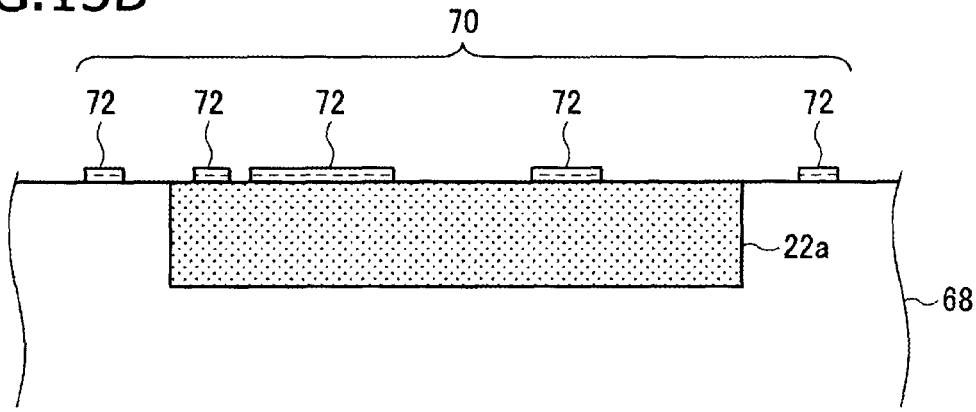

FIGS. 14A-24B illustrate the manufacturing method of the semiconductor device 2. FIGS. 14A, 15A . . . 24A are plan views. FIGS. 14B, 15B . . . 24B are cross sections along the lines XIVB-XIVB, XVB-XVB . . . XXIVB-XXIVB depicted in FIGS. 14A, 15A . . . 24A, respectively.

—Formation of the First Semiconductor Region (FIGS. 14A and 14B)—

First, prepared is a p-type semiconductor substrate (for example, p-type Si substrate) of which resistivity is around 10 Ω·cm. The surface of the semiconductor substrate is oxidized to form a protection film (not illustrated) of around 10 nm thickness.

Next, as illustrated in FIG. 14B, a first resist film 66a, in which an opening corresponding to the first semiconductor region 22a is provided, is formed on the protection film. In FIG. 14A, the first resist film 66a is not illustrated.

Through the first resist film 66a, for example, phosphor ions (P$^+$) are ion-implanted into the semiconductor substrate 68. By means of this, an n-type impurity is introduced into a semiconductor region 69 corresponding to the first semiconductor region 22a. An acceleration voltage is 2 MeV, for example. A dose is $3.50 \times 10^{12}$ cm$^{-2}$, for example. Thereafter, the first resist film 66a is stripped.

Next, the semiconductor substrate 68 is annealed to activate the implanted phosphor. At this time, the implanted phosphor is diffused. An annealing temperature is 1,150° C., for example. An annealing time is 360 minutes, for example. An annealing atmosphere is N$_2$, for example. By means of this, the first semiconductor region 22a (n-type body region) is formed.

—Formation of Trenches (FIGS. 15A and 16B)—

First, the protection film on the semiconductor substrate 68 is removed. Thereafter, the semiconductor substrate 68 is oxidized again to form a protection film (not illustrated) of around 15 nm thickness. An oxidization temperature is around 900° C., for example.

On the protection film, a nitride film (SiN film) of around 150 nm is formed by the vapor growth method. Then the nitride film is etched to form spaces corresponding to the field insulating films 40. By means of this, an etching mask 70 is formed as illustrated in FIGS. 15A and 15B. The etching mask 70 is a pattern that includes a plurality of nitride films 72 with certain shapes.

Figure 16A:
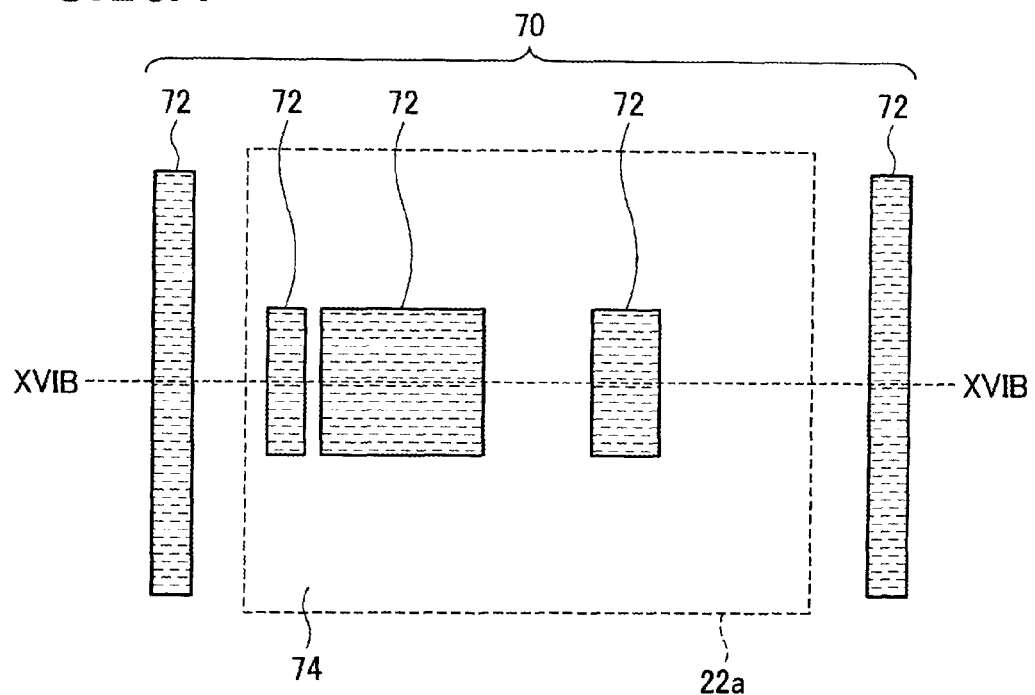
FIGS. 16A and 16B illustrate the manufacturing methods of the semiconductor device according to the embodiment 1.
Figure 16B:
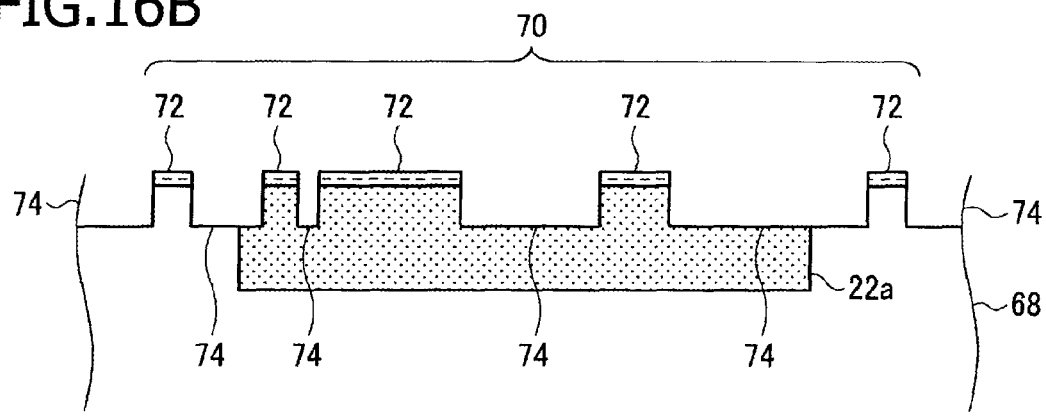

Through the etching mask 70, the semiconductor substrate 68 is etched to form trenches 74 around 350 nm deep, as illustrated in FIGS. 16A and 16B.

—Formation of Field Insulating Film (FIGS. 17A and 17B)—

First, the surface of the semiconductor substrate 68 is oxidized to form an oxide film of around 40 nm thickness, on the inner wall of the trench 74. Thereafter, an oxide film of around 675 nm thickness is grown by the vapor growth method to fill each trench 74 with the oxide film.

Figure 17A:
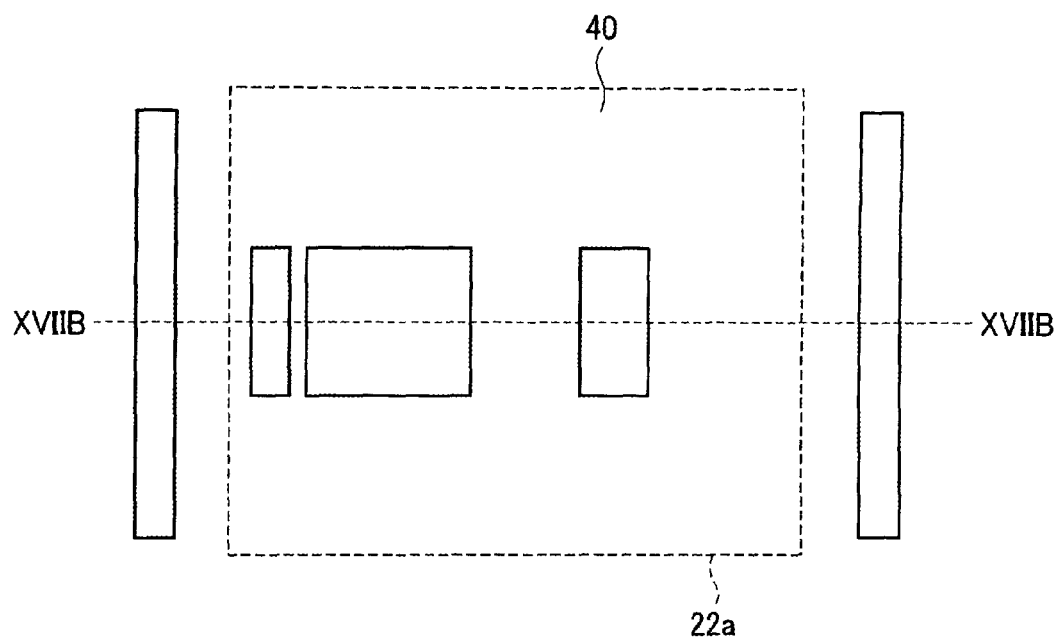
FIGS. 17A and 17B illustrate the manufacturing methods of the semiconductor device according to the embodiment 1.
Figure 17B:
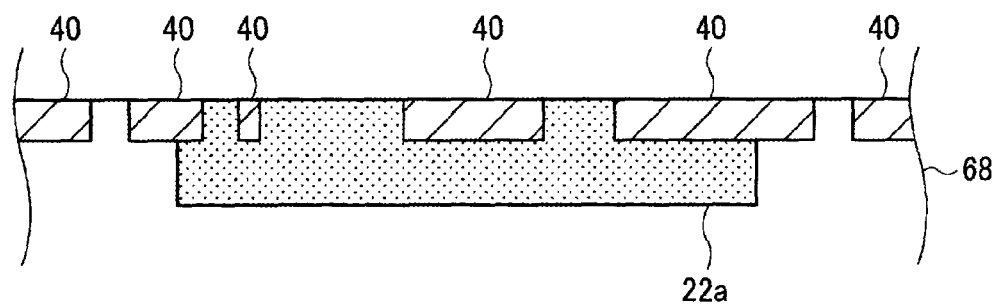

Next, the grown oxide film is polished by CMP (chemical mechanical polishing) until the nitride film 72 is exposed, to flatten the grown oxide film. Thereafter, the nitride film 72 and the protection film (not illustrated) are removed to complete the field insulating film 40, as illustrated in FIGS. 17A and 17B.

—Formation of Drift Region Etc. (FIGS. 18A and 18B)—

The semiconductor substrate 68 is oxidized again to form a protection film (not illustrated) of around 10 nm thickness. An oxidization temperature is around 900° C., for example.

Figure 18A:
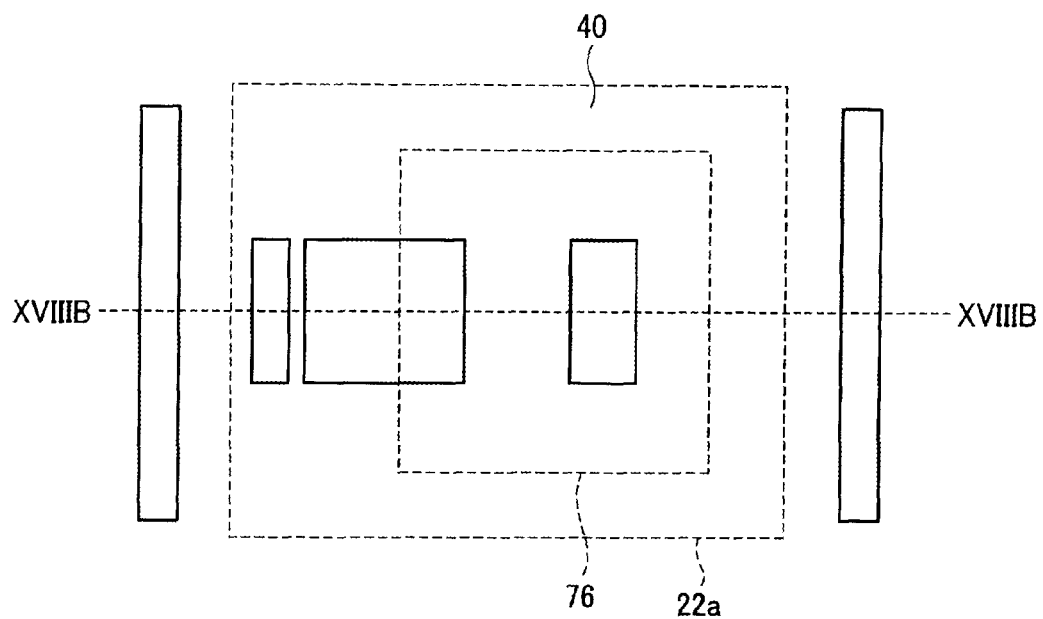
FIGS. 18A and 18B illustrate the manufacturing methods of the semiconductor device according to the embodiment 1.
Figure 18B:
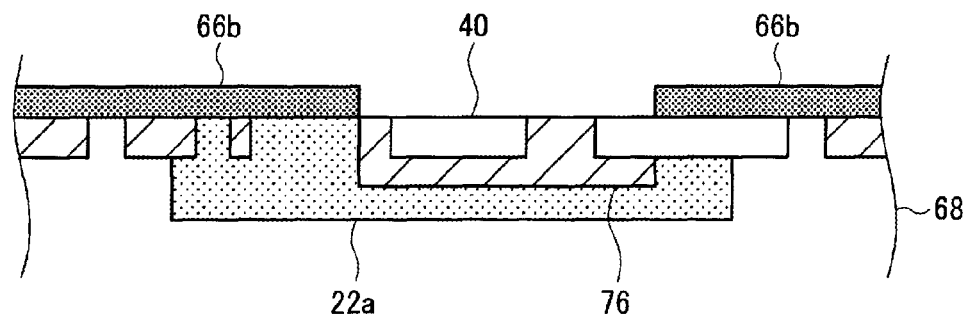

Next, as illustrated in FIG. 18B, a second resist film 66b, in which an opening corresponding to the drift region 12 is provided, is formed on the protection film (not illustrated). In FIG. 18A, the second resist film 66b is not illustrated.

Through the second resist film 66b, for example, boron ions ($B^+$) are ion-implanted into the semiconductor substrate 68. By means of this, a p-type impurity is introduced in a semiconductor region 76 corresponding to the drift region 12, for example. An acceleration voltage is 150 keV, for example. A dose is $5.5 \times 10^{12}$ cm$^{-2}$, for example. Thereafter, the second resist film 66b is stripped.

Further, through a resist film (not illustrated) in which an opening is provided, for example, arsenic ions ($As^+$) are ion-implanted into a semiconductor region corresponding to the channel region 16. By the arsenic (n-type impurity) introduced at this time, the threshold of the semiconductor device 2 is adjusted.

An acceleration voltage is 80 keV, for example. A dose is $1.0 \times 10^{12}$ cm$^{-2}$, for example. A distance between the channel region 16 and the drift region 12 is around 0.4 µm, for example.

Figure 19A:
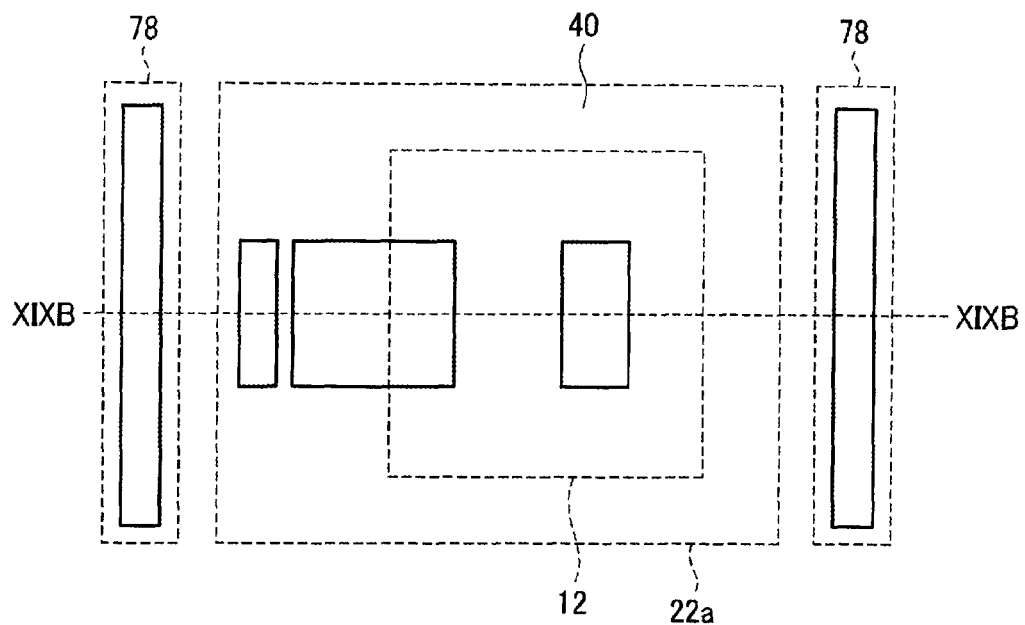
FIGS. 19A and 19B illustrate the manufacturing methods of the semiconductor device according to the embodiment 1.
Figure 19B:
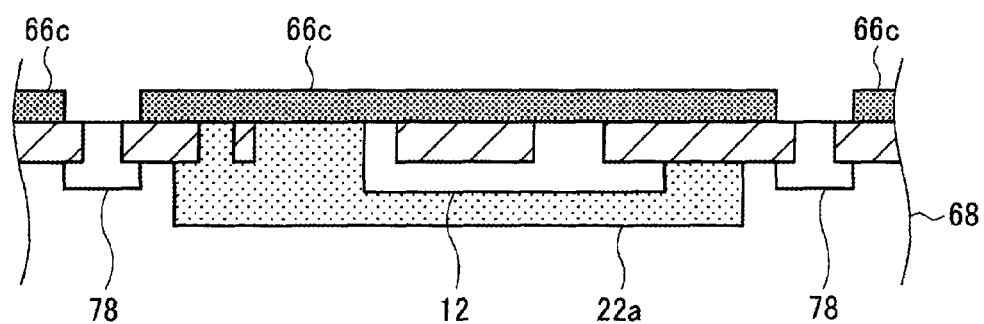

Next, as illustrated in FIG. 19B, a third resist film 66c, in which an opening corresponding to the substrate tap region 38 is provided, is formed on a protection film (not illustrated). In FIG. 19A, the third resist film 66c is not illustrated.

Through the third resist film 66c, for example, boron ions ($B^k$) are ion-implanted twice into the semiconductor substrate 68. By means of this, a p-type impurity is introduced into a semiconductor region 78 corresponding to the substrate tap region 38. Acceleration voltages are 230 keV and 13 keV, for example. Doses are $3.0 \times 10^{13}$ cm$^{-2}$ and $1.5 \times 10^{13}$ cm$^{-2}$, for example. Thereafter, the third resist film 66c is stripped.

Next, the semiconductor substrate 68 is annealed to activate the ion-implanted impurities. An annealing temperature is 1,000° C., for example. An annealing time is 10 seconds, for example. An annealing atmosphere is $N_2$, for example. By means of this, the drift region 12 and the channel region 16 are completed.

—Formation of Gate Insulating Film (FIGS. 20A and 20B)—

Figure 20A:
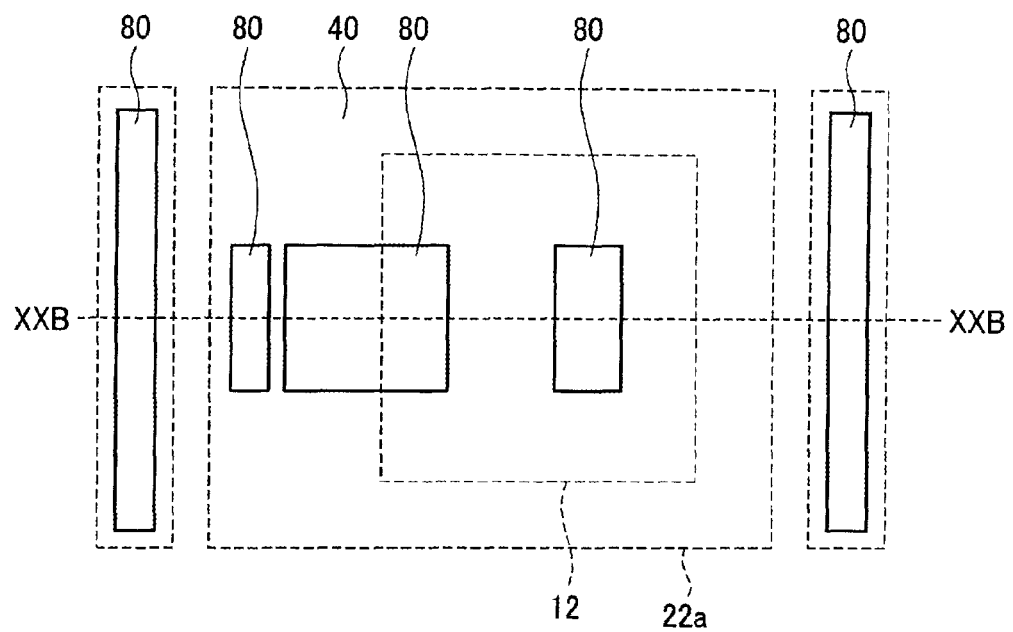
FIGS. 20A and 20B illustrate the manufacturing methods of the semiconductor device according to the embodiment 1.
Figure 20B:
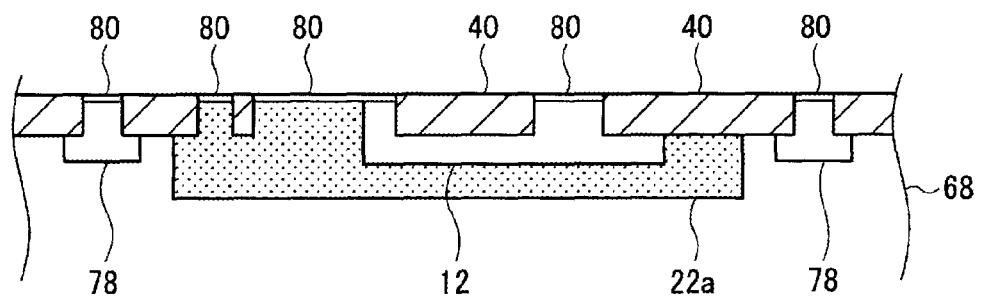

Next, the protection film (not illustrated) is removed. Thereafter, the surface of the semiconductor substrate 68 is oxidized to form an oxide film 80 of around 18 nm thickness, as illustrated in FIG. 20B. An oxidization temperature is 800° C., for example. An atmosphere is a wet oxidation atmosphere.

—Formation of Gate Electrode (FIGS. 21A and 21B)—

On the semiconductor substrate 68 on which the oxide film 80 is formed, polysilicon of around 180 nm in thickness is grown by the vapor growth method.

Figure 21A:
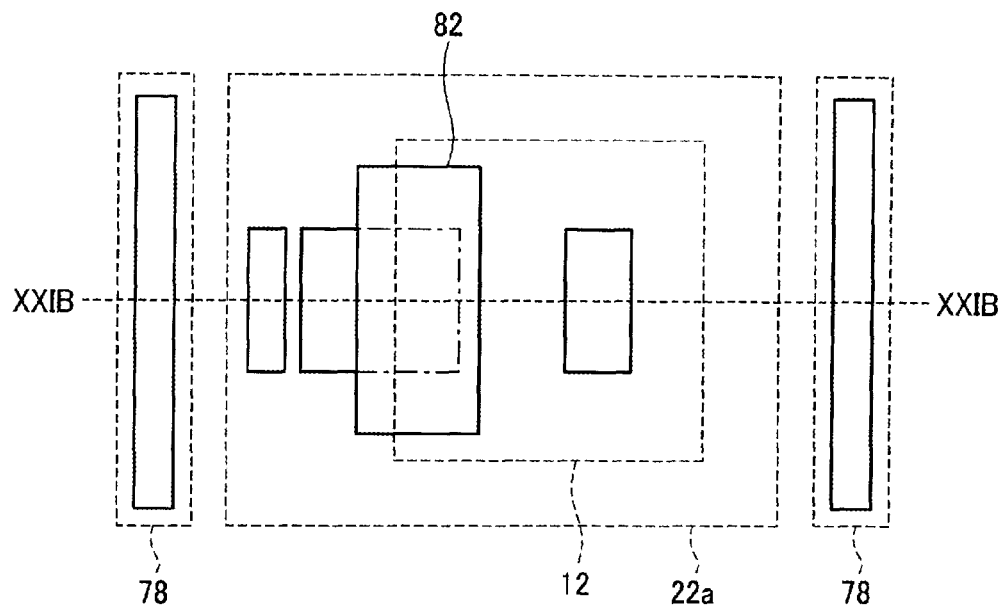
FIGS. 21A and 21B illustrate the manufacturing methods of the semiconductor device according to the embodiment 1.
Figure 21B:
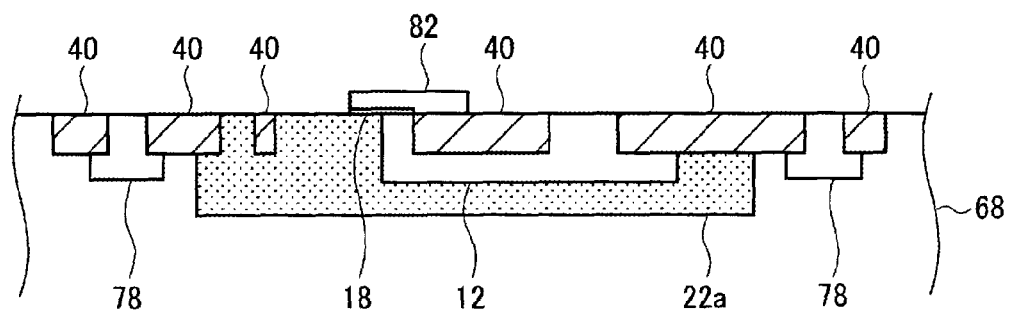

The polysilicon is etched to form a polysilicon film 82 corresponding to the gate electrode 20, as illustrated in FIGS. 21A and 21B. At this time the oxide film 80 is etched, so that a gate insulating film 18 is formed.

—Formation of Source Region, Drain Region, Substrate Tap Region and Body Tap Region—

Next, through a resist film (not illustrated) in which openings are provided, for example, $BF_2^+$ ions are ion-implanted into each semiconductor region corresponding to the source region 10, the drain region 14 and the substrate tap region 38. An acceleration voltage is 80 keV, for example. A dose is $4.5 \times 10^{13}$ cm$^{-2}$, for example. Thereafter, the resist film is stripped.

Further, a sidewall is formed on the side face of the polysilicon film 82. Thereafter, through a resist film (not illustrated) in which an opening is provided, for example, boron ions ($B^+$) and fluorine ions ($F^+$) are ion-implanted into semiconductor regions respectively corresponding to the source region 10, the drain region 14 and the substrate tap region 38, and the polysilicon film 82. Acceleration voltages are 5 keV and 8 keV, for example. Doses are $2.0 \times 10^{15}$ cm$^{-2}$ and $4.0 \times 10^{14}$ cm$^{-2}$, for example. Thereafter, the resist film is stripped.

Further, through a resist film (not illustrated) in which an opening is provided, for example, $P^+$ ions are ion-implanted into a semiconductor region corresponding to the body tap region 36. An acceleration voltage is 15 keV, for example. A dose is $2.0 \times 10^{15}$ cm$^{-2}$, for example.

Thereafter, the semiconductor substrate 68 is annealed. An annealing temperature is 1,000° C., for example. An annealing time is 10 seconds, for example. An annealing atmosphere is $N_2$, for example. By means of this, the source region 10, the drain region 14, the substrate tap region 38 and the body tap region are completed. Further, the polysilicon film 82 becomes the p type, and the gate electrode 20 is completed.

By means of the above annealing, the impurities, which are implanted into the semiconductor region corresponding to the source region 10, diffuse laterally. As a result, the source region 10 is formed that is partially covered by the gate electrode 20.

—Formation of Contact Electrodes (FIGS. 22A and 22B)—

Next, the oxide film that covers the source region 10, the drain region 14, the body tap region 36 and the substrate tap region 38 is removed. Thereafter, by means of spattering, a cobalt film of 6 nm thickness is formed on the surface of the semiconductor substrate 68.

The semiconductor substrate 68, on which the cobalt film is formed, is annealed to primarily form a cobalt silicide. An annealing temperature is 540° C., for example. An annealing atmosphere is $N_2$, for example. An annealing time is 30 seconds, for example. Thereafter, unreacted cobalt is removed in a self-forming manner. Thereafter, the semiconductor substrate 68 is further annealed to secondarily form a cobalt silicide.

Figure 22A:
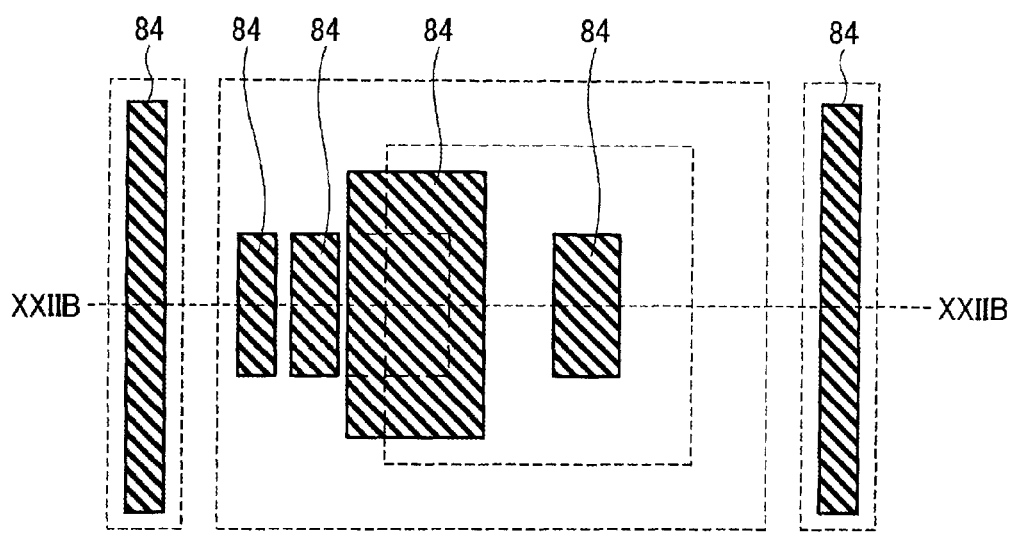
FIGS. 22A and 22B illustrate the manufacturing methods of the semiconductor device according to the embodiment 1.
Figure 22B:
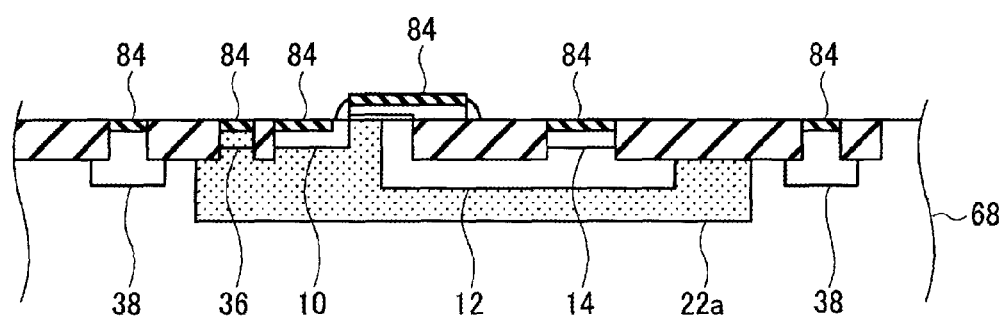

By means of this, contact electrodes 84 of cobalt silicide are formed, as illustrated in FIGS. 22A and 22B.

—Formation of Contact Plugs (FIGS. 23A and 23B)—

Figure 23A:
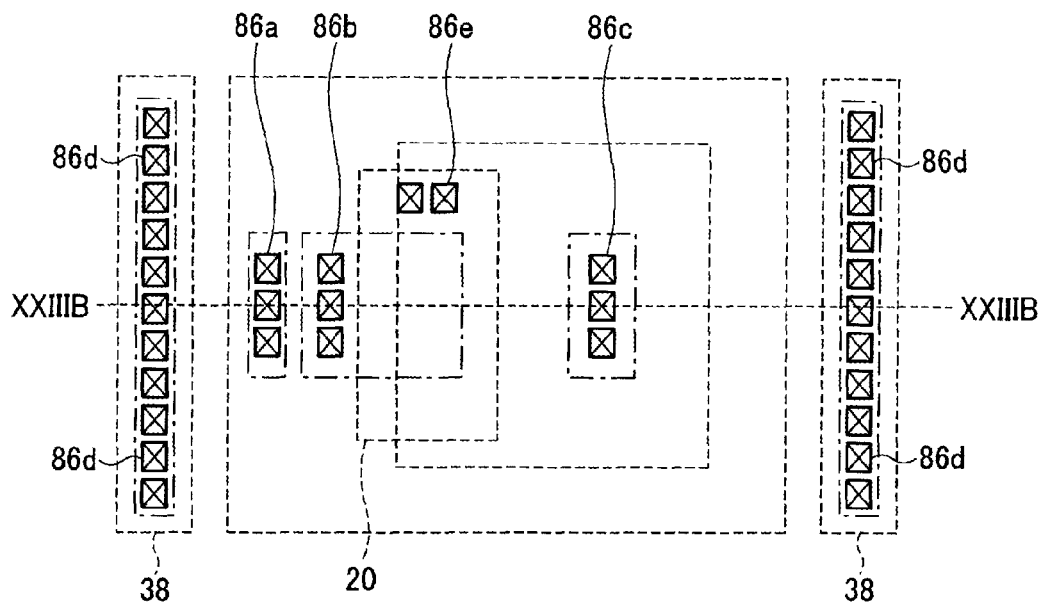
FIGS. 23A and 23B illustrate the manufacturing methods of the semiconductor device according to the embodiment 1.
Figure 23B:
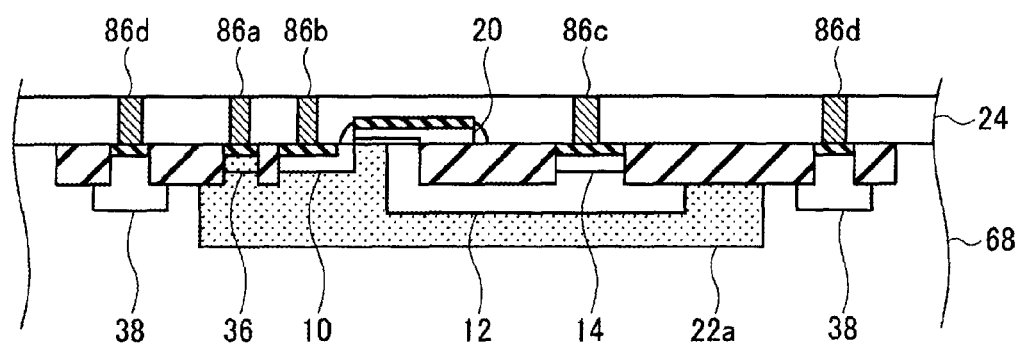

On the semiconductor substrate 68 on which the contact electrodes 84 are formed, an interlayer insulating film 24, which is the first layer, is deposited. Contact holes are formed in the interlayer insulating film 24. Thereafter, formed are a barrier metal (not illustrated) and the first contact plugs 86a-the fifth contact plugs 86e. In FIG. 23A, the contact electrodes 84 are not illustrated.

The first contact plugs 86a-the fifth contact plugs 86e are respectively connected to the body tap region 36, the source region 10, the drain region 14, the substrate tap regions 38 and the gate electrode 20. The first contact plugs 86a-the fifth contact plugs 86e are tungsten contact plugs, for example.

—Formation of First Shield Wiring Etc. (FIGS. 24A and 24B)—

Figure 24A:
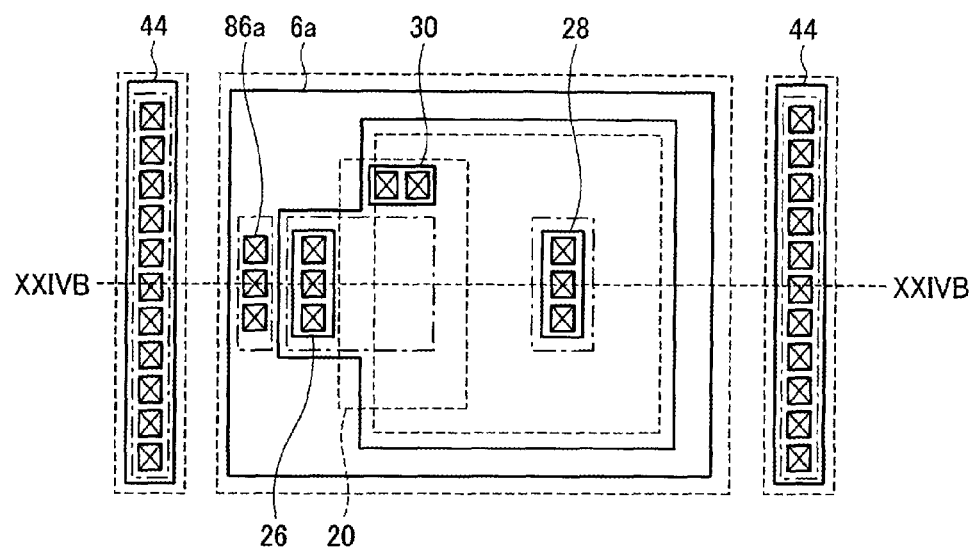
FIGS. 24A and 24B illustrate the manufacturing methods of the semiconductor device according to the embodiment 1.
Figure 24B:
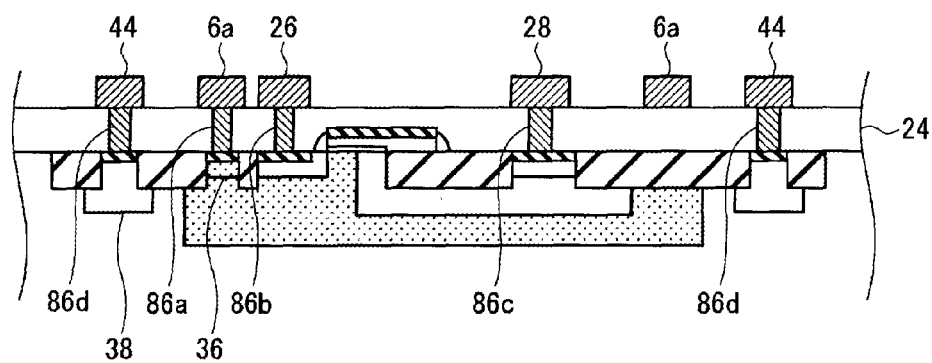

A conductive film (for example, AlCuTi film) is deposited on the interlayer insulating film 24 (the first layer) through which the first contact plugs 86a-the fifth contact plugs 86e are formed. The conductive film is etched to form the first shield wiring 6a, the source wiring 26, the drain wiring 28, the substrate tap wiring 44 and the gate wiring 30. In FIG. 24A, the contact electrodes 84 are not illustrated.

The first shield wiring 6a is connected to the body tap region 36 through the first contact plugs 86a. The source wiring 26 etc. are connected to corresponding regions through the second contact plugs 86b-the fifth contact plugs 86e, respectively.

—Formation of Interlayer Insulating Films (the Second Layer—the Uppermost Layer) and Low Potential Wiring—

Thereafter, formed are interlayer insulating films (the second layer—the uppermost layer), contact plugs and wirings. On the uppermost interlayer insulating film, for example, the low potential wiring 9 is formed that is connected to the substrate tap region 38.

(Embodiment 2)

The embodiment 2 resembles the embodiment 1. Therefore, the description of common parts in the embodiments 1 and 2 will be omitted or simplified.

Figure 25:
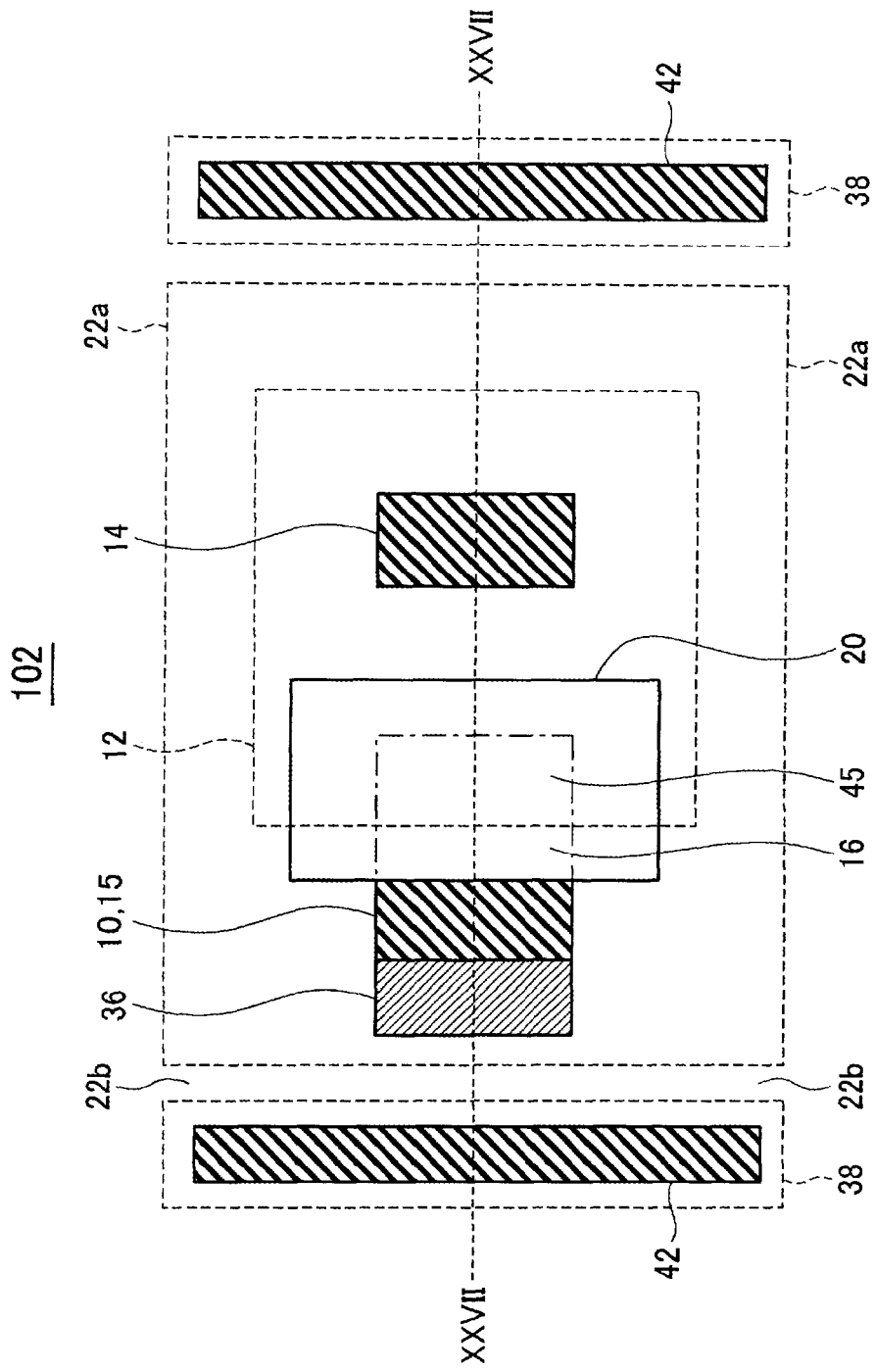
FIG. 25 illustrates a plan view of a semiconductor device according to an embodiment 2.
Figure 26:
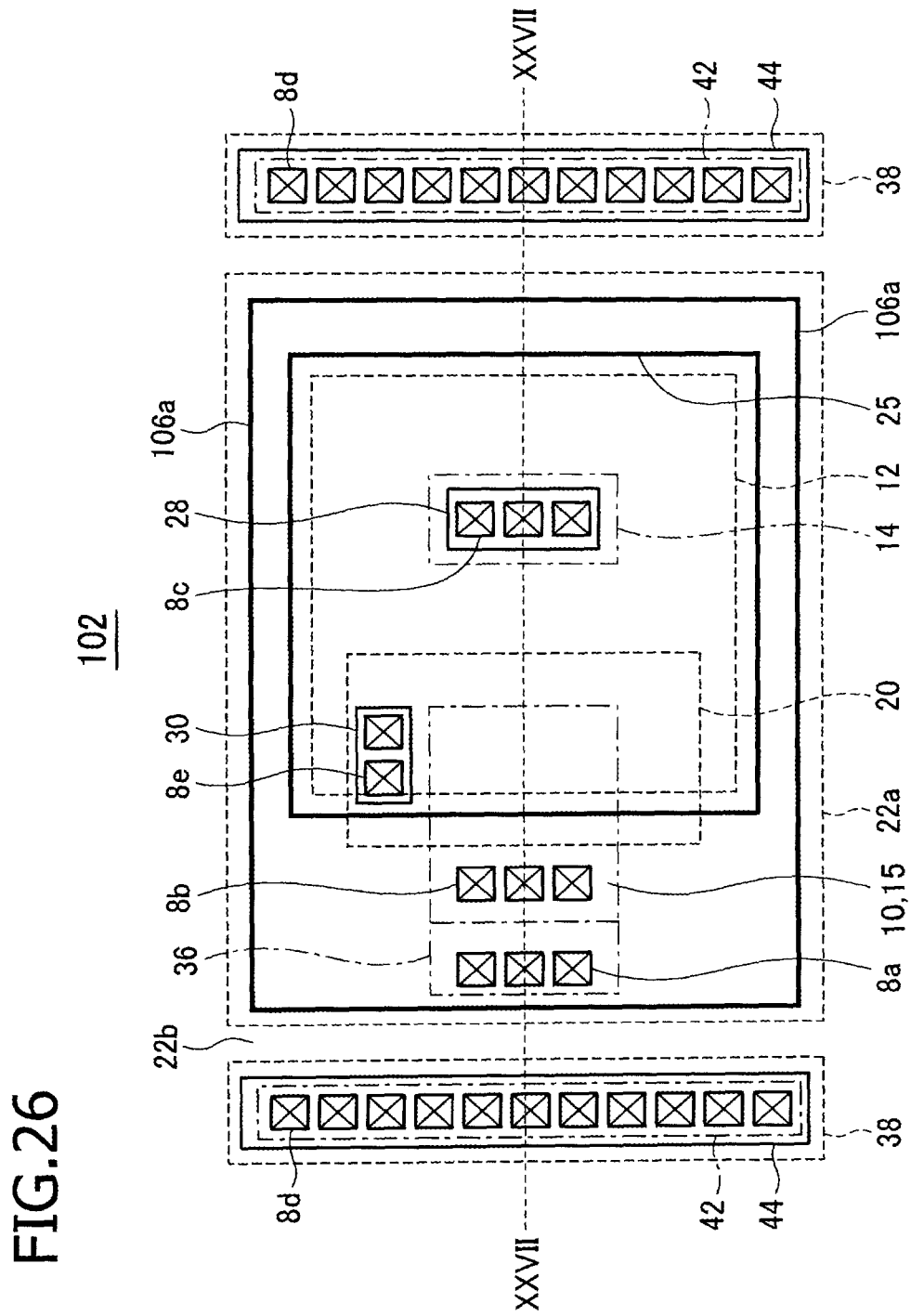
FIG. 26 illustrates a plan view of the semiconductor device according to the embodiment 2.
Figure 27:
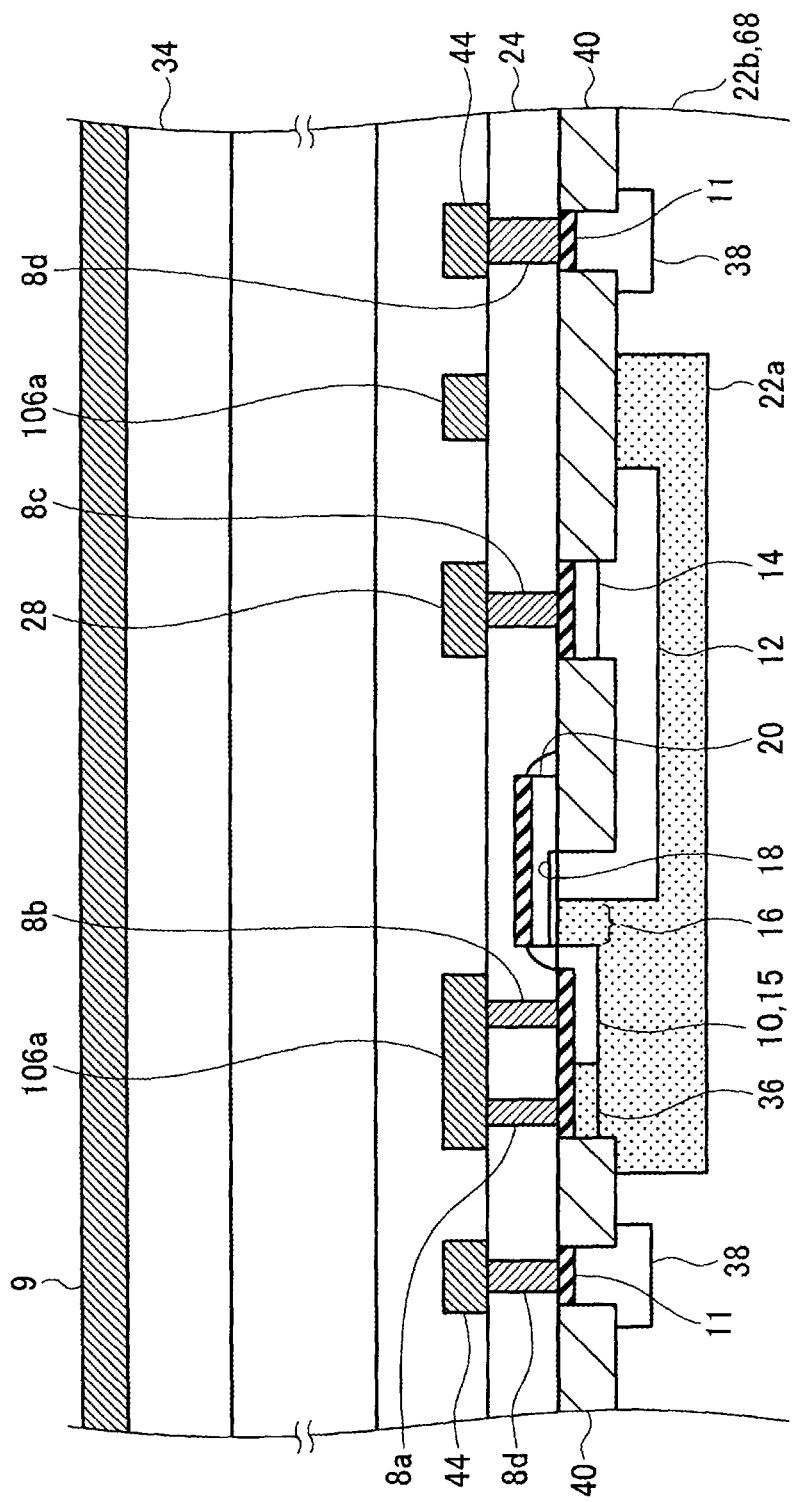
FIG. 27 illustrates a cross section along the line XXVII-XXVII depicted in FIGS. 25 and 26.

FIGS. 25 and 26 illustrate plan views of a semiconductor device 102 according to the embodiment 2. FIG. 27 illustrates a cross section along the line XXVII-XXVII depicted in FIGS. 25 and 26.

FIG. 25 illustrates the structure of the semiconductor device 102 (LDMOS transistor) at a substrate surface (the surface of a substrate on which the semiconductor device 102 is formed). FIG. 26 illustrates wirings (the first shield wiring 106a etc.) provided on the interlayer insulating film 24 (refer to FIG. 27), which is the first layer, and the first contact plugs 8a-the fifth contact plugs 8e provided in the interlayer insulating film 24 (the first layer). Broken lines and alternate long and short dash lines depicted in FIG. 26 illustrate the structure of the substrate surface (refer to FIG. 25). In FIGS. 25 and 26, contact electrodes 11 are omitted.

As illustrated in FIG. 25, the structure of the substrate surface of the semiconductor device 102 is almost identical to the structure of the substrate surface of the semiconductor device 2 according to the embodiment 1. Here, in the semiconductor device 102 depicted in FIG. 25, a source region 10 contacts to a body tap region 36. However, the source region 10 may be separated from the body tap region 36. Similarly to the semiconductor device 2 of the embodiment 1, the semiconductor device 102 includes the first shield wiring 106a (refer to FIG. 26) and a low potential wiring 9 (refer to FIG. 27).

As illustrated in FIGS. 26 and 27, the first shield wiring 106a is connected to the first semiconductor region 22a and the source region 10. Furthermore, the first shield wiring 106a covers a portion 15 of the source region 10 that is not covered by a gate electrode 20 (in FIG. 26, the portion 15 is coincident with the source region 10). The low potential wiring 9 faces the first semiconductor region 22a across the first shield wiring 106a.

Preferably, the semiconductor device 102 includes a p-type second semiconductor region 22b (refer to FIG. 27) that encloses the first semiconductor region 22a (refer to FIG. 25).

There is no possibility of the existence of a path (geometric path) that connects the source region 10 to a drift region 12 (or a drain region 14) without passing through the first shield wiring 106a, in a plan view. Similarly, there is no possibility of the existence of a path (geometric path) that connects the source region 10 to the second semiconductor region 22b without passing through the first shield wiring 106a, in a plan view. That is to say, the first shield wiring 106a isolates the source region 10 from the drift region 12 (or the drain region 14) and the second semiconductor region 22b.

Therefore, in the semiconductor device 102, formed is neither the first current path 52a nor the second current path 52b that have been explained in reference to FIG. 7. For this reason, according to the semiconductor device 102, suppressed is the leakage current of the semiconductor device that includes the LDMOS transistor.

As illustrated in FIG. 26, the first shield wiring 106a preferably includes the inner edge (inner periphery) 25 that encloses the drift region 12 inside the first semiconductor region 22a in a plan view.

In this case, there is no possibility of the existence of a path (geometric path) that connects the drift region 12 to the second semiconductor region 22b without passing through the first shield wiring 106a in a plan view. That is to say, the first shield wiring 106a isolates the drift region 12 from the second semiconductor region 22b. As a result, a third current path 52c is not formed, and therefore the leakage current is further suppressed.

Similarly to the first shield wiring 6a of the embodiment 1, preferably the first shield wiring 106a does not extend between the gate electrode 20 and the drain region 14.

In the semiconductor device 102 illustrated in FIG. 26, the first shield wiring 106a covers the whole source region 10. However, the first shield wiring 106a may partially cover the source region 10.

Even though the first shield wiring 106a partially covers the source region 10, the first current path 52a and the second current path 52b are narrowed. As a result, the leakage current reduces. In the case that the first shield wiring 106a partially covers the source region 10, preferably the portion of the source region 10 that is covered by neither the first shield wiring 106a nor the gate electrode 20 is enclosed by the first shield wiring 106a and the gate electrode 20 in a plan view.

(Embodiment 3)

An embodiment 3 resembles the embodiment 1. Therefore, the description of common parts in the embodiments 1 and 3 will be omitted or simplified.

Figure 28:
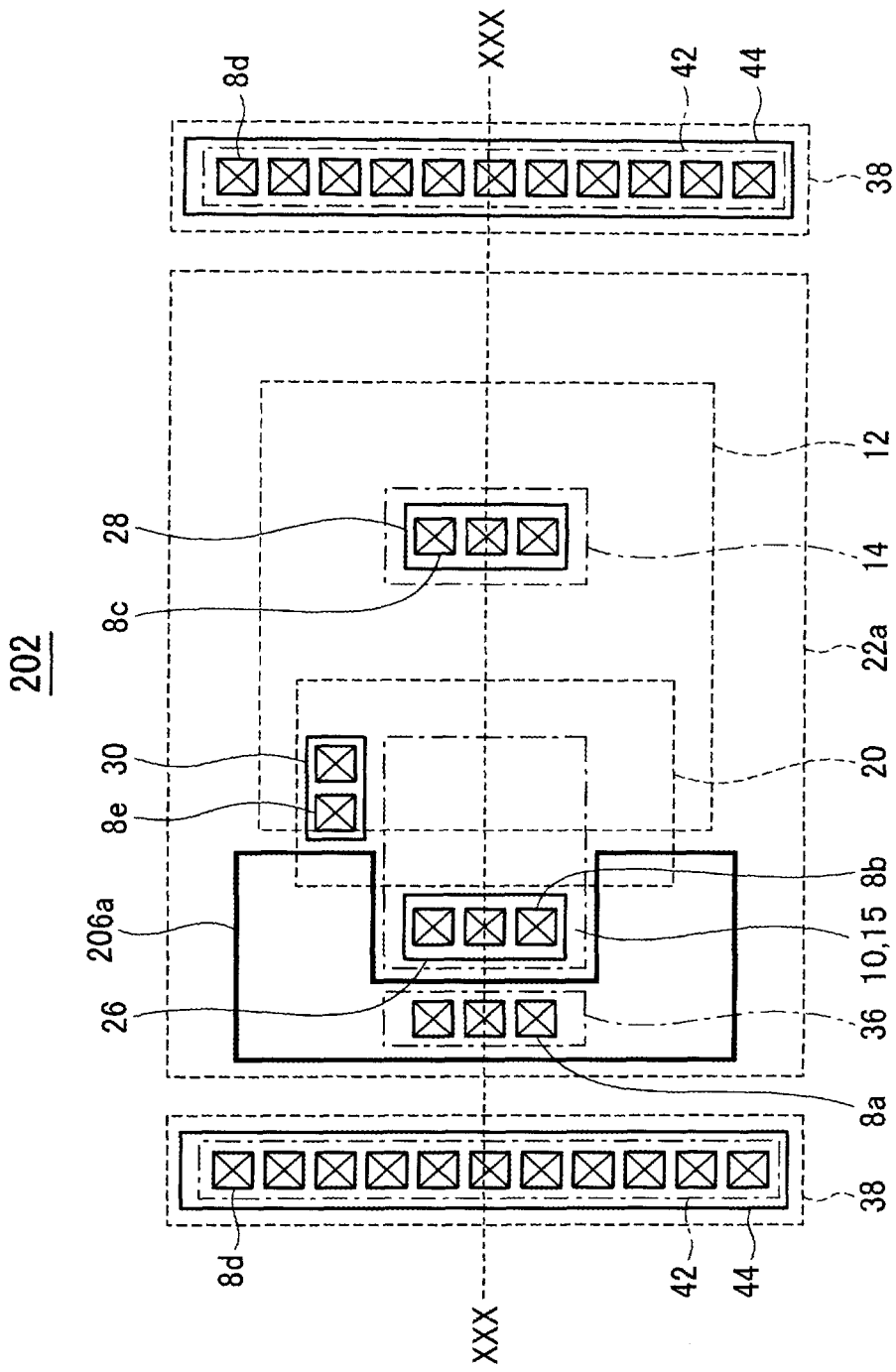
FIG. 28 illustrates a plan view of a semiconductor device according to an embodiment 3.
Figure 29:
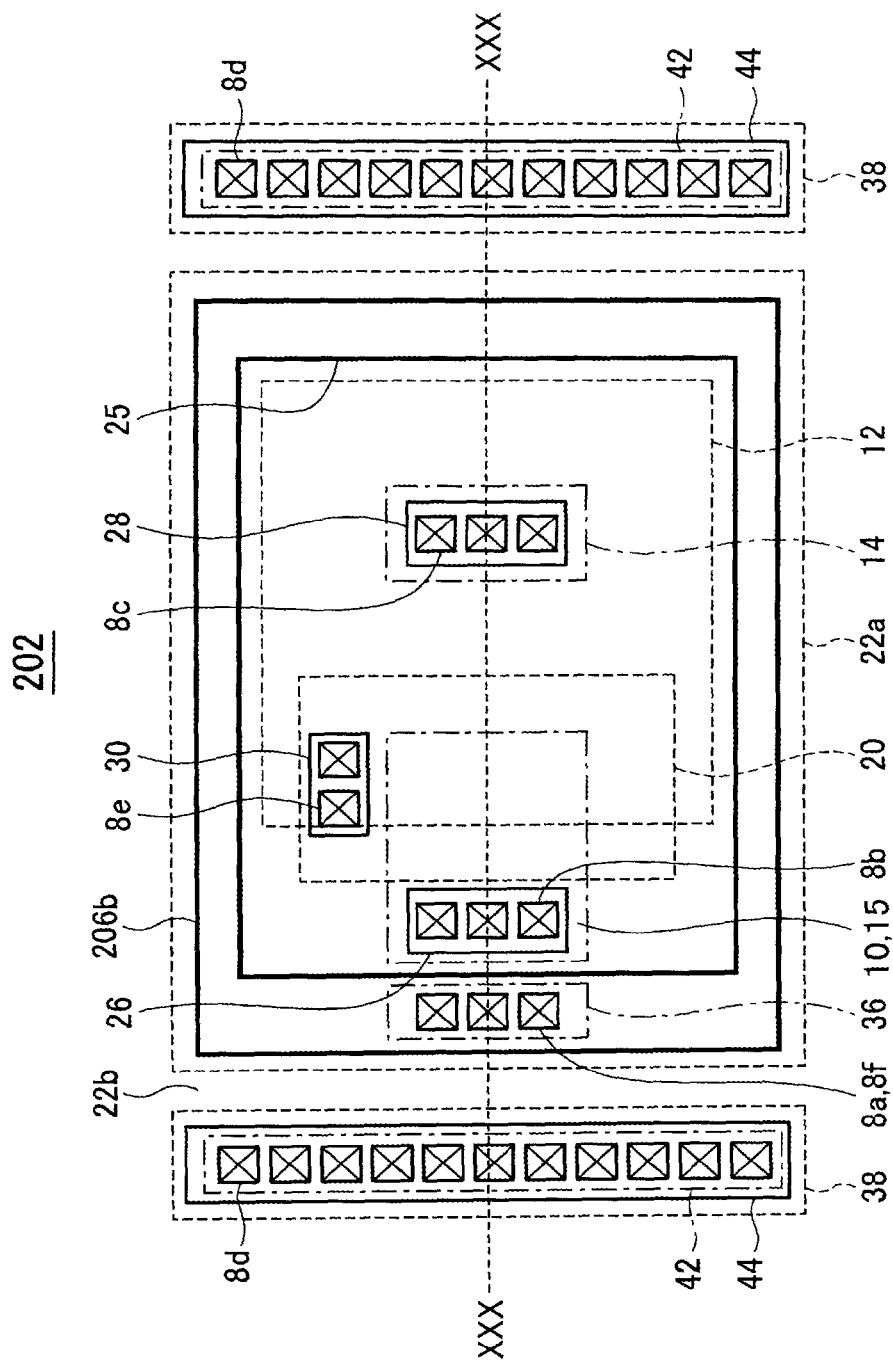
FIG. 29 illustrates a plan view of the semiconductor device according to the embodiment 3.
Figure 30:
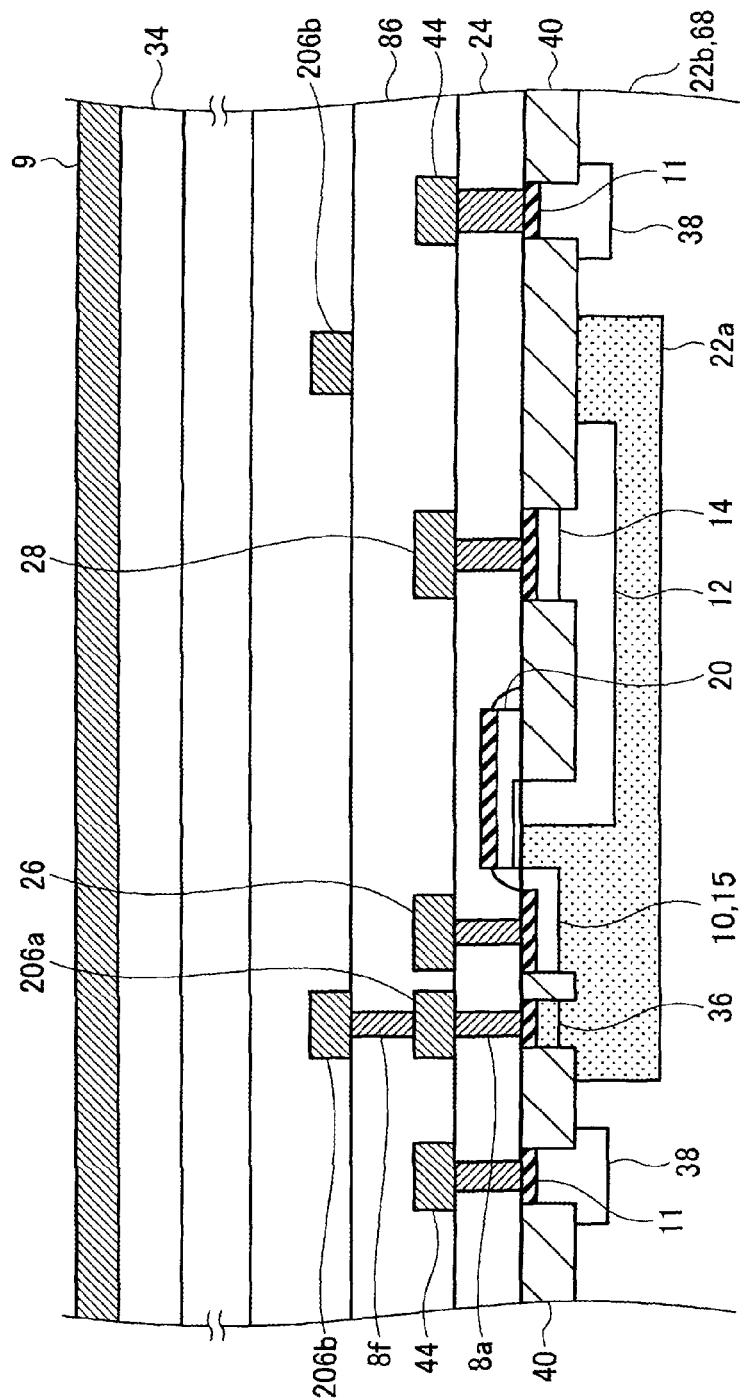
FIG. 30 illustrates a cross section along the line XXX-XXX depicted in FIGS. 28 and 29.

FIGS. 28 and 29 illustrate plan views of a semiconductor device 202 according to the embodiment 3. FIG. 30 illustrates a cross section along the line XXX-XXX depicted in FIGS. 28 and 29.

FIG. 28 illustrates wirings (the first shield wiring 206a etc.) provided on an interlayer insulating film 24 (refer to FIG. 30), which is the first layer, for example. FIG. 29 illustrates a second shield wiring 206b provided on an interlayer insulating film 86 (refer to FIG. 30), which is the second layer, and sixth contact plugs 8f provided in the interlayer insulating film 86 (the second layer).

FIGS. 28 and 29 further illustrate the first contact plugs 8a-the fifth contact plugs 8e provided in the interlayer insulating film 24 (the first layer), for example. Broken lines and alternate long and short dash lines depicted in FIGS. 28 and 29 illustrate the structure of a substrate surface (the surface of a substrate on which the semiconductor device 202 is formed). In FIGS. 28 and 29, the contact electrodes 11 are omitted.

The structure of the substrate surface of the semiconductor device 202 (LDMOS transistor) is substantially identical to the structure of the substrate surface of the semiconductor device 2 according to the embodiment 1. Therefore, the description of the substrate surface structure in the semiconductor device 202 is omitted.

The semiconductor device 202 includes a first shield wiring 206a (refer to FIG. 28), a second shield wiring 206b (refer to FIG. 29), the second semiconductor region 22b (refer to FIG. 30) and the low potential wiring 9 (refer to FIG. 30).

As illustrated in FIG. 28, the semiconductor device 202 includes the first shield wiring 206a that encloses a portion 15 of the source region 10 that is not covered by a gate electrode 20, in a plan view (in FIG. 28, the portion 15 is coincident with the source region 10) in conjunction with the gate electrode 20. The first shield wiring 206a faces a first semiconductor region 22a across the first interlayer insulating film 24 (the first layer). The first shield wiring 206a is connected to the first semiconductor region 22a through the first contact plugs 8a provided in the interlayer insulating film 24 (the first layer), for example.

There is no possibility of existence of a path (geometric path) that connects the source region 10 to a drift region 12 (or a drain region 14) without passing through any of the first shield wiring 206a and the gate electrode 20, in a plan view. Similarly, there is no possibility of the existence of a path (geometric path) that connects the source region 10 to the second semiconductor region 22b without passing through any of the first shield wiring 206a and the gate electrode 20, in a plan view. That is to say, the first shield wiring 206a isolates the source region 10 from the drift region 12 (or the drain region 14) and the second semiconductor region 22b in conjunction with the gate electrode 20.

Therefore, formed in the semiconductor device 202 is neither the first current path 52a nor the second current path 52b explained above by reference to FIG. 7. For this reason, according to the semiconductor device 202, the leakage current of the semiconductor device that includes the LDMOS transistor is suppressed.

As illustrated in FIG. 29, the semiconductor device 202 includes a second shield wiring 206b including an inner edge (inner periphery) 25 that encloses at least the drift region 12 in the first semiconductor region 22a, in a plan view.

Furthermore, the second shield wiring 206b faces the first semiconductor region 22a across interlayer insulating films (for example, the interlayer insulating film 24 (the first layer) and the interlayer insulating film 86 (the second layer)). The second shield wiring 206b is connected to the first semiconductor region 22a through the first contact plugs 8a provided in the interlayer insulating film 24 (first layer) and the sixth contact plugs 8f provided in the interlayer insulating film 86 (the second layer), for example.

There is no possibility of existence of a path (geometric path) that connects the drift region 12 to the second semiconductor region 22b without passing through the second shield wiring 206b, in a plan view. That is to say, the second shield wiring 206b isolates the drift region 12 from the second semiconductor region 22b. By means of this, a third current path 52c is not formed. Therefore, the leakage current is further suppressed.

Similarly to the first shield wiring 6a of the embodiment 1, the first shield wiring 206a and the second shield wiring 206b preferably do not extend between the gate electrode 20 and the drain region 14.

(Embodiment 4)

An embodiment 4 resembles the embodiment 1. Therefore, the description of common parts in the embodiments 1 and 4 will be omitted or simplified.

Figure 31:
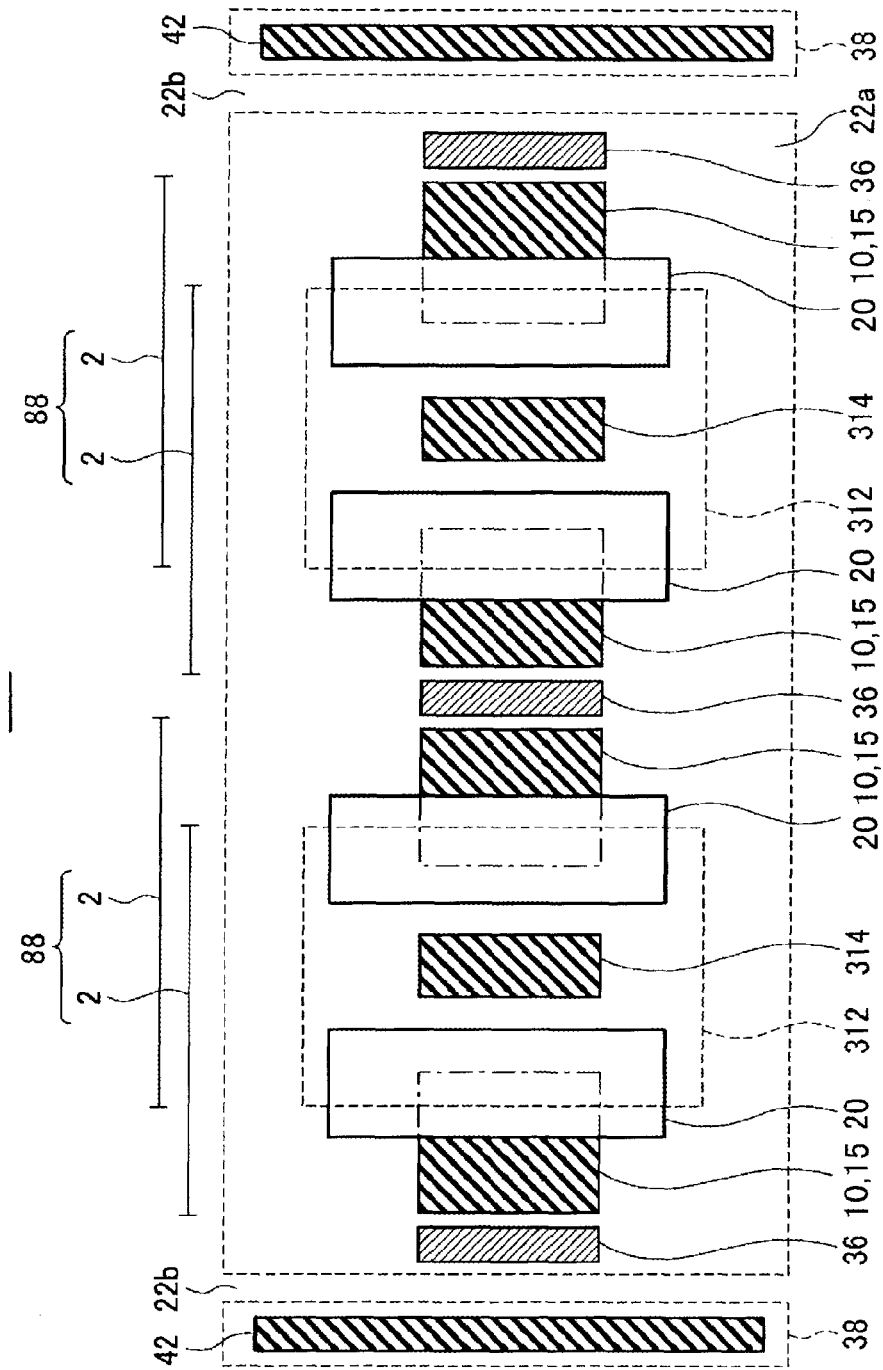
FIG. 31 illustrates a plan view of a semiconductor device according to an embodiment 4.
Figure 32:
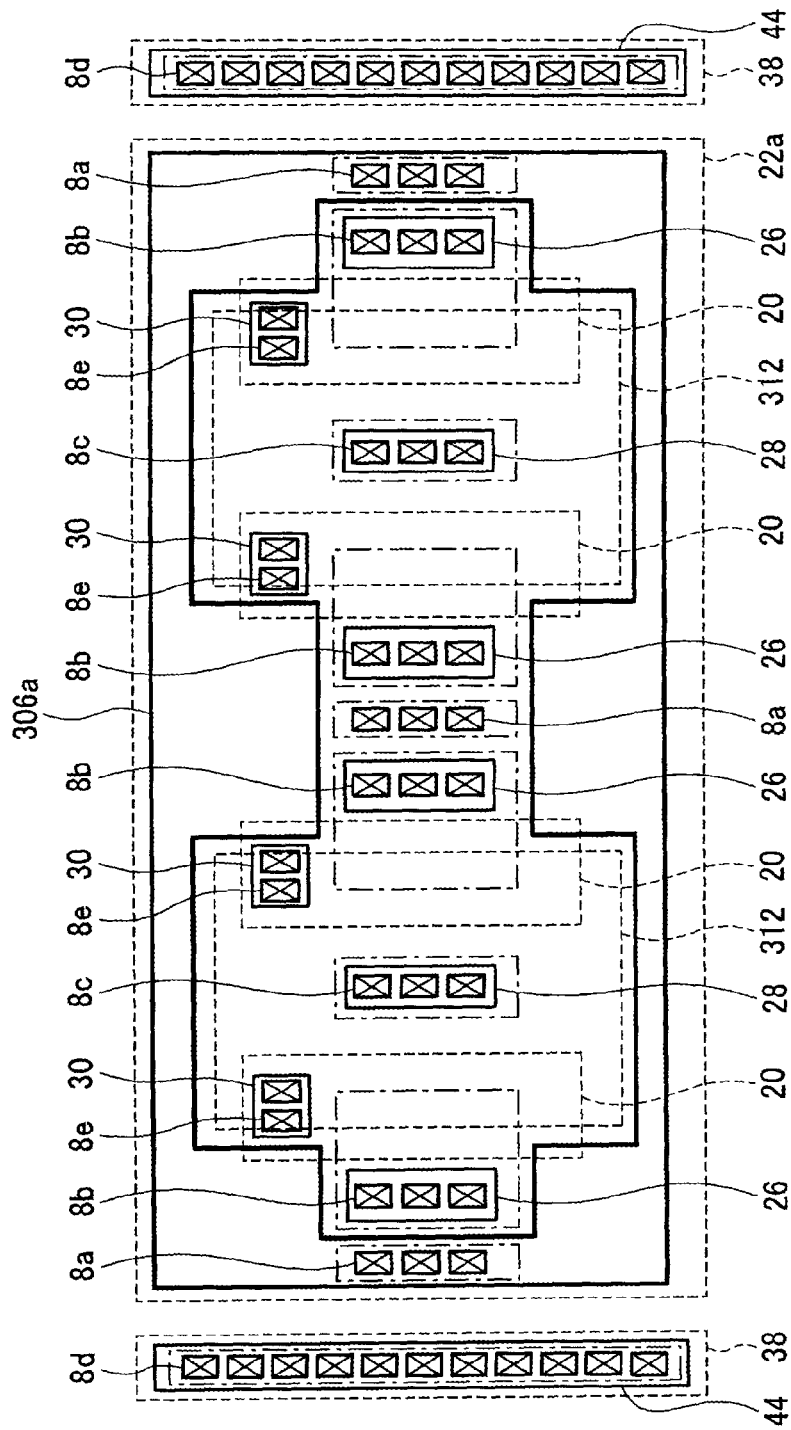
FIG. 32 illustrates a plan view of the semiconductor device according to the embodiment 4.

FIGS. 31 and 32 illustrate plan views of a semiconductor device 302 according to the embodiment 4. FIG. 31 illustrates the structure of the semiconductor device 302 (a plurality of LDMOS transistors) at a substrate surface (a surface of a substrate on which the semiconductor device 302 is formed). FIG. 32 illustrates wirings (first shield wiring 306a etc.) provided on the interlayer insulating film 24 (the first layer) and the first contact plugs 8a-the fifth contact plugs 8e provided in the interlayer insulating film 24 (the first layer). FIG. 32 further illustrates the structure of the substrate surface (refer to FIG. 31) with broken lines and alternate long and short dash lines. In FIGS. 31 and 32, the contact electrodes 11 are omitted.

As illustrated in FIGS. 31 and 32, the semiconductor device 302 includes a plurality of the semiconductor devices 2 (each of which is the semiconductor device 2 of the embodiment 1) that share the first shield wiring 306a (refer to FIG. 32). The first shield wiring 306a is connected to a first semiconductor region 22. The first shield wiring 306a encloses a portion 15 of a source region 10 that is not covered by a gate electrode 20, in a plan view in conjunction with the gate electrode 20.

As illustrated in FIG. 31, the plurality of semiconductor devices 2 further share the first semiconductor region 22a and a second semiconductor region 22b. Furthermore, the plurality of semiconductor devices 2 share the body tap regions 36 and the substrate tap regions 38.

As illustrated in FIG. 31, the semiconductor device 302 includes a plurality of pairs 88 of the semiconductor devices 2 which share a drift region 312 and a drain region 314.

With such a configuration, the leakage current of the semiconductor device 302 is suppressed, similarly to the leakage current of the semiconductor device 2 of the embodiment 1. Furthermore, the output of the semiconductor device 302 is large, because the semiconductor device 302 includes a plurality of the semiconductor devices 2 of the embodiment 1.

(Embodiment 5)

An embodiment 5 resembles the embodiment 1. Therefore, the description of common parts in the embodiments 1 and 5 will be omitted or simplified.

Figure 33:
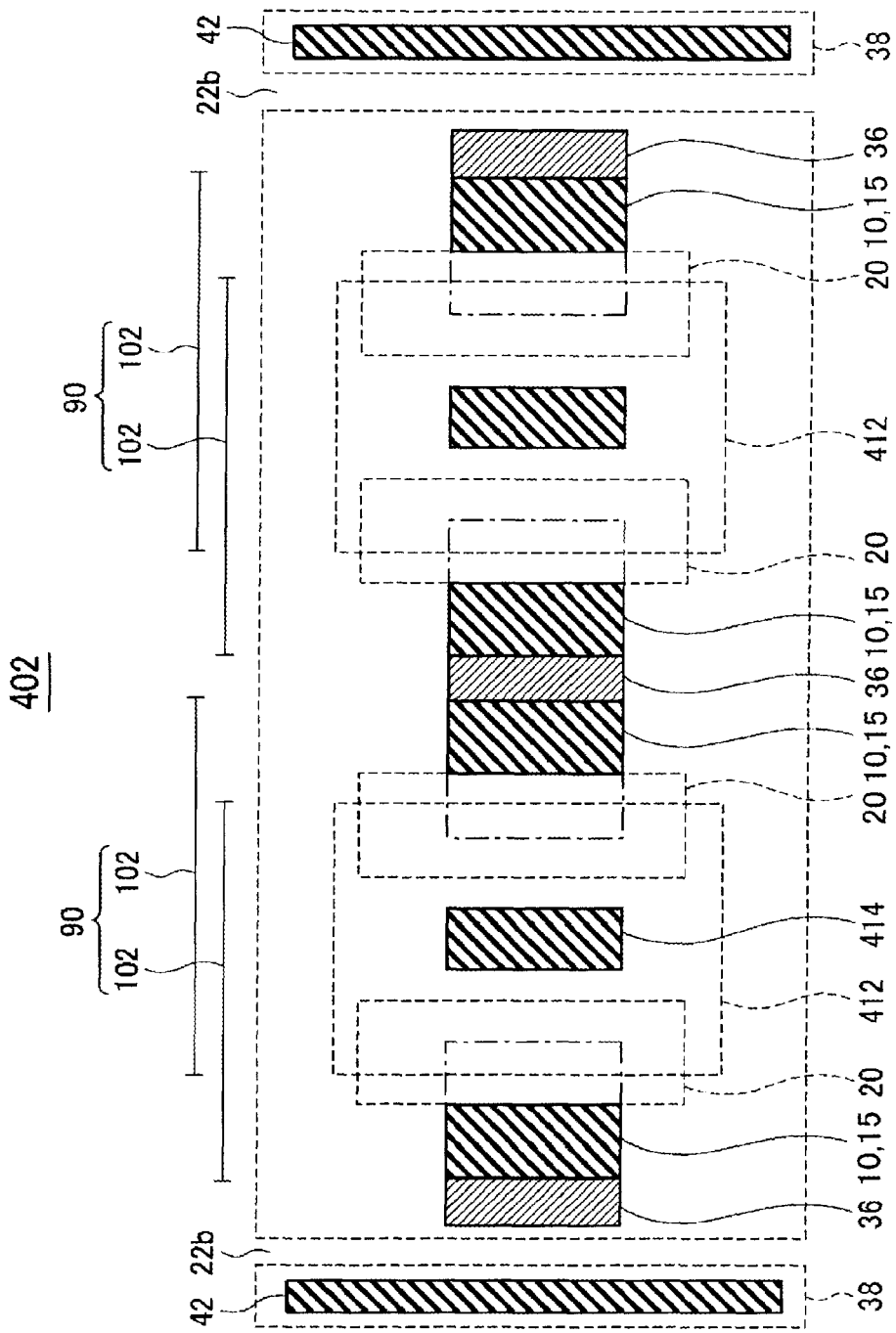
FIG. 33 illustrates a plan view of a semiconductor device according to an embodiment 5.
Figure 34:
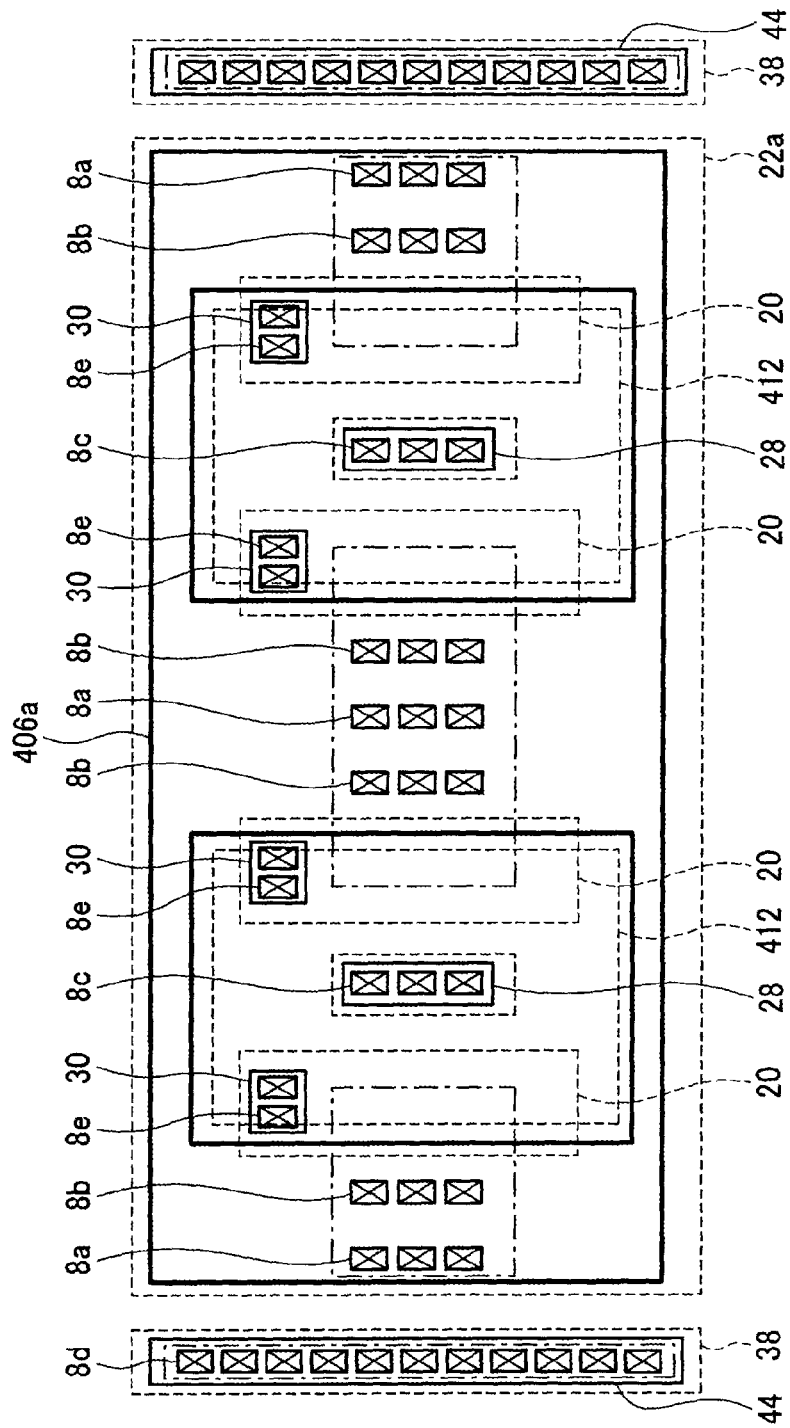
FIG. 34 illustrates a plan view of the semiconductor device according to the embodiment 5.

FIGS. 33 and 34 illustrate plan views of a semiconductor device 402 according to the embodiment 5. FIG. 33 illustrates the structure of the semiconductor device 402 (a plurality of LDMOS transistors) at a substrate surface (a surface of a substrate on which the semiconductor device 402 is formed). FIG. 34 illustrates wirings (a first shield wiring 406a etc.) provided on the interlayer insulating film 24 (the first layer) and the first contact plugs 8a-the fifth contact plugs 8e provided in the interlayer insulating film 24 (the first layer). FIG. 34 further illustrates the structure of the substrate surface (refer to FIG. 33) with broken lines and long and alternate short dash lines. In FIGS. 33 and 34, the contact electrodes 11 are omitted.

As illustrated in FIGS. 33 and 34, the semiconductor device 402 includes a plurality of the semiconductor devices 102 (each of which is the semiconductor device 102 of the embodiment 2) that share the first shield wiring 406a (refer to FIG. 34). The first shield wiring 406a is connected to the first semiconductor region 22a and the source region 10 (refer to FIG. 31), and covers a portion 15 of the source region 10 that is not covered by a gate electrode 20.

As illustrated in FIG. 33, the plurality of semiconductor devices 102 further share the first semiconductor region 22a and a second semiconductor region 22b. The plurality of the semiconductor devices 102 further share the body tap regions 36 and the substrate tap regions 38.

As illustrated in FIG. 33, the semiconductor device 402 includes a plurality of pairs 90 of the semiconductor devices 102 which share a drift region 412 and a drain region 414.

With such a configuration, the leakage current of the semiconductor device 402 is suppressed similarly to the leakage current of the semiconductor device 102 of the embodiment 2. Furthermore, the output of the semiconductor device 402 is large because the semiconductor device 402 includes a plurality of the semiconductor devices 102 of the embodiment 2.

In the embodiments 1-5, the first conductivity type is a p-type, and the second conductivity type is an n-type. However, the first conductivity type may be an n-type and the second conductivity type may be a p-type. In this case, the potential of the wiring 9 that faces the first semiconductor region across the first shield wiring is higher than the potential of the source region 10. The wiring 9 is, for example, a power wiring (or power line).

In the embodiments 1-5, the most portion of the first semiconductor region 22a and the second semiconductor region 22b are covered by the field insulating film 40. However, the first semiconductor region 22a and the second semiconductor region 22b may not be covered by the field insulating film 40.

The semiconductor devices of the embodiments 1-5 include the wirings 9 that face the first semiconductor region across the first shield wiring. However, it may be possible that the semiconductor devices of the embodiments 1-5 do not include such a wiring.

Even though such a wiring is not included, an inversion layer may be formed in the first semiconductor region in some cases, due to an electric field from a region adjacent to the first semiconductor region or an electric field from outside the device. A leakage current caused by such an electric field may be suppressed by providing the first shield wiring and/or the second shield wiring.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a semiconductor substrate that includes a channel region;
   a gate insulating film formed on the channel region of the semiconductor substrate;
   a gate electrode formed on the gate insulating film;
   a source region of a first conductivity type formed in the semiconductor substrate;
   a drain region of the first conductivity type formed in the semiconductor substrate;
   a drift region of the first conductivity type formed between the channel region and the drain region, the drift region having an impurity concentration lower than an impurity concentration of the drain region;
   a first semiconductor region of a second conductivity type opposite to the first conductivity type that encloses the source region, the drift region and the drain region, and includes the channel region in a plan view;
   a first shield wiring formed above the semiconductor substrate and electrically connected to the first semiconductor region; and
   a second shield wiring formed above the first shield wiring and electrically connected to the first shield wiring,
   wherein the source region includes a first portion that is not covered by the gate electrode in a plan view;
   the first portion is enclosed by the first shield wiring together with the gate electrode in a plan view, and
   the drift region is enclosed by an inner edge of the second shield wiring in a plan view, the inner edge being located above the first shield wiring.

2. The semiconductor device according to claim 1, further comprising:
   a second semiconductor region of the first conductivity type that encloses the first semiconductor region in a plan view.

3. The semiconductor device according to claim 1, wherein the first shield wiring is not disposed between the gate electrode and the drain region in a plan view.

4. The semiconductor device according to claim 1, wherein the second shield wiring is not disposed between the gate electrode and the drain region in a plan view.

5. The semiconductor device according to claim 1, further comprising:
   a wiring formed above the second shield wiring.

6. The semiconductor device according to claim 1, wherein a distance between the drain region and the channel region in a direction from the source region to the drain region is longer than a length of the channel region in the direction.

7. The semiconductor device according to claim 1, further comprising
   a first contact plug, that is connected to the first shield wiring, formed on the first semiconductor region,
   wherein the first semiconductor region includes a first part located under the first contact plug and a second part located under the gate electrode, and
   the first part and the second part is located continuously.

8. The semiconductor device according to claim 1, wherein the inner edge of the second shield wiring is located in the first semiconductor region in a plan view.

9. The semiconductor device according to claim 1, wherein the first shield wiring is located in a first interlayer insulating film; and
   whole of the second shield wiring is located on the first interlayer insulating film.

10. A semiconductor device comprising:
    a semiconductor substrate that includes a channel region;
    a gate insulating film formed on the channel region of the semiconductor substrate;
    a gate electrode formed on the gate insulating film;
    a source region of a first conductivity type formed in the semiconductor substrate;
    a drain region of the first conductivity type formed in the semiconductor substrate;
    a drift region of the first conductivity type formed between the channel region and the drain region, the drift region having an impurity concentration lower than an impurity concentration of the drain region;
    a first semiconductor region of a second conductivity type opposite to the first conductivity type that encloses the source region, the drift region and the drain region, and includes the channel region in a plan view;
    a first shield wiring formed above the semiconductor substrate and electrically connected to the first semiconductor region and the source region; and
    a second shield wiring formed above the first shield wiring and electrically connected to the first shield wiring,
    wherein the source region is covered by the first shield wiring in a plan view, and
    the drift region is enclosed by an inner edge of the second shield wiring in a plan view, the inner edge being located above the first shield wiring.

11. The semiconductor device according to claim 10, further comprising:
a second semiconductor region of the first conductivity type that encloses the first semiconductor region in a plan view.

12. The semiconductor device according to claim 10, wherein the first shield wiring is not disposed between the gate electrode and the drain region in a plan view.

13. The semiconductor device according to claim 10, wherein the second shield wiring is not disposed between the gate electrode and the drain region in a plan view.

14. The semiconductor device according to claim 10, further comprising:
a wiring formed above the second shield wiring.

15. The semiconductor device according to claim 10, wherein a distance between the drain region and the channel region in a direction from the source region to the drain region is longer than a length of the channel region in the direction.

16. The semiconductor device according to claim 10, further comprising
a first contact plug, that is connected to the first shield wiring, formed on the first semiconductor region,
wherein the first semiconductor region includes a first part located under the first contact plug and a second part located under the gate electrode, and
the first part and the second part is located continuously.

17. The semiconductor device according to claim 16; wherein
material of the first contact plug is different from material of the first shield wiring.

18. The semiconductor device according to claim 10, wherein
the inner edge of the second shield wiring is located in the first semiconductor region in a plan view.

19. The semiconductor device according to claim 10, wherein
the first shield wiring is located in a first interlayer insulating film; and
whole of the second shield wiring is located on the first interlayer insulating film.

* * * * *